(12) United States Patent
Hamrick et al.

(10) Patent No.: US 12,207,411 B2
(45) Date of Patent: Jan. 21, 2025

(54) PRINTED WIRING BOARDS, PRINTED WIRING BOARD ASSEMBLIES, AND ELECTRONIC SYSTEMS

(71) Applicant: Micron Technology, Inc., Boise, ID (US)

(72) Inventors: Kristopher D. Hamrick, Boise, ID (US); Bradley R. Bitz, Boise, ID (US); James J. Oleary, Boise, ID (US); Mark A Tverdy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 17/820,315

(22) Filed: Aug. 17, 2022

(65) Prior Publication Data

US 2024/0064906 A1     Feb. 22, 2024

(51) Int. Cl.
    *H05K 1/18*        (2006.01)
    *H05K 1/11*        (2006.01)

(52) U.S. Cl.
CPC ............. *H05K 1/183* (2013.01); *H05K 1/111* (2013.01); *H05K 2201/09036* (2013.01); *H05K 2201/09472* (2013.01); *H05K 2201/10159* (2013.01); *H05K 2201/10674* (2013.01)

(58) Field of Classification Search
None
See application file for complete search history.

(56) References Cited

U.S. PATENT DOCUMENTS

2014/0138138 A1*   5/2014   Park ..................... H01G 2/06
                                                                                                  174/260

FOREIGN PATENT DOCUMENTS

CN       108601202 A *   9/2018        H05K 1/0204

OTHER PUBLICATIONS

CN 108601202 A (Translation) (Year: 2024).*

\* cited by examiner

*Primary Examiner* — Hoa C Nguyen
*Assistant Examiner* — John B Freal
(74) *Attorney, Agent, or Firm* — TraskBritt

(57) ABSTRACT

A printed wiring board is disclosed, with a build-up lamination material comprising a die side and a land side; a recess in the build-up lamination material at the die side, the recess comprising a recess floor; a first wall orthogonal to the recess floor; a second wall orthogonal to the recess floor, the second wall spaced apart from and opposite the first wall; a first recessed contact pad including a first vertical portion substantially in the recess at the first wall; a second recessed contact pad including a second vertical portion substantially in the recess at the second wall; and electrical coupling structures within the build-up lamination material, the electrical coupling structures coupled to each of the first recessed contact pad and the second recessed contact pad.

19 Claims, 12 Drawing Sheets

PRINTED WIRING BOARDS, PRINTED WIRING BOARD ASSEMBLIES, AND ELECTRONIC SYSTEMS

TECHNICAL FIELD

The disclosure, in various embodiments, relates generally to the field of integrated circuit device package substrates including interconnections for components on the integrated circuit device substrates. More specifically, the disclosure relates to recessed interconnections for components in integrated circuit device package substrates.

BACKGROUND

Integrated circuit devices may be mounted on printed wiring boards such as mother boards and microelectronic device package boards. Package boards may be used for mounting microelectronic devices and in turn for mounting the package boards on larger structures such as mother boards. It is desired to improve package boards as a result of challenges of miniaturization both for fabricating integrated circuits on semiconductor wafers, and for coupling diced integrated circuits to the package boards.

DETAILED DESCRIPTION

Figure 1A:
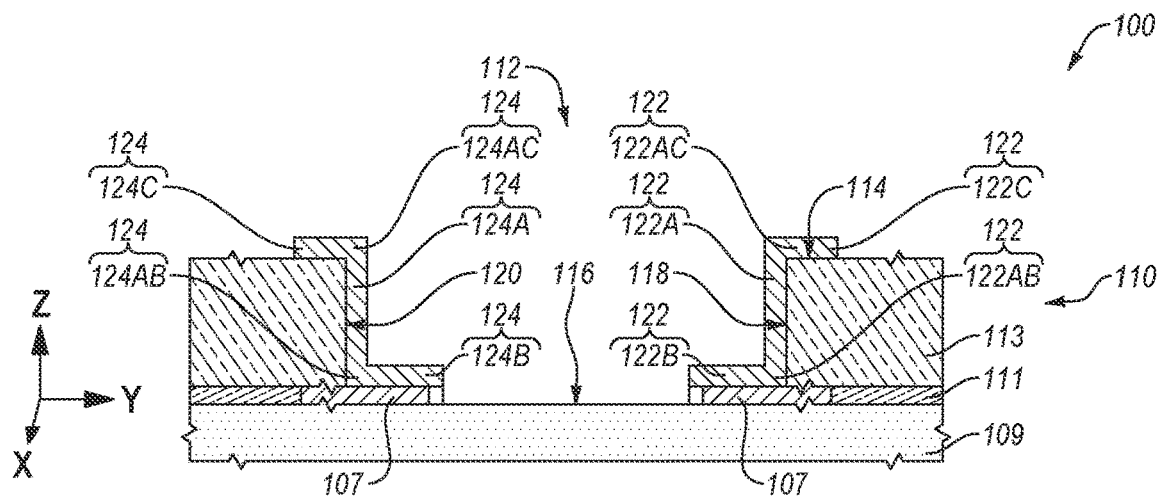
FIG. 1A is a simplified, longitudinal cross-section view of a portion of a semiconductor device package substrate assembly, in accordance with embodiments of the disclosure.

Components that support active microelectronic devices such as processors and memory, require both a footprint on a board such as a printed wiring board, as well as a vertical profile height. Useful lower profile components would resolve both footprint issues as well as vertical profile height, where the components may be embedded in the printed wiring board, and may be located in areas not previously useful. Recessed contact pad embodiments allow lower profile component and shared footprint deployments on printed wiring boards.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device package substrate fabrication techniques employed in the industry. In addition, the description provided below does not form a complete process flow for manufacturing a microelectronic device package substrates (e.g., a package substrate for a memory device, a package substrate for an integrated-circuit device, a package substrate for a disaggregated-die integrated circuit device). The structures described below do not form a complete microelectronic device package substrate. However, those process acts and structures are useful to understand the embodiments of the disclosure are described in detail below. Additional acts to form a complete microelectronic device package substrate from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "printed wiring board" refers to a board for mounting electronic device components, such as a motherboard or printed circuit board (PCB), and the printed wiring board includes electrical traces, contact vias, and contact pads for coupling electronic device components onto the printed wiring board.

As used herein, the term "package substrate" refers to a printed wiring board for mounting a microelectronic device such as a processor microelectronic device or at least one memory microelectronic device, and the package substrate may be in turn mountable upon a larger printed wiring board such as a motherboard. A package substrate may be an embedded trace substrate assembly where principal portions of electrical connection structures may be below top organic surfaces of the package substrate. An embedded trace substrate assembly may be a base for assembling a disaggregated-die integrated circuit system.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radio-frequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be coupled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis. Further as used herein, a gate width direction may be presented as a "W" axis in a CMOS device, where the Y-axis is supplanted with the W-axis to indicate the direction of a gate width.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, "semiconductor substrate" means constructions comprising semiconductive material, including, but not limited to, bulk semiconductive materials such as a semiconductive wafer (either alone or in assemblies comprising other materials), and semiconductive material layers or characteristic structures (either alone or in assemblies comprising other materials). The term "substrate" refers to any supporting structure, including, but not limited to, the semiconductor substrates described above. In some applications the substrate may correspond to a semiconductor substrate containing one or more materials associated with integrated circuit fabrication. Such materials may include, for example, one or more of refractory metal materials, barrier materials, diffusion materials, insulator materials, etc.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1A is a simplified, longitudinal cross-section view of a portion of a printed wiring board assembly 100 (also referred to herein as a "semiconductor device mounting substrate assembly") including recessed contact pads, according to embodiments of the disclosure. The printed wiring board assembly 100 may be part of a motherboard. The printed wiring board assembly 100 may be part of a package board. The printed wiring board assembly 100 may be part of a memory-module board such as for an array of DRAMs. A build-up lamination assembly 110 of the printed wiring board assembly 100 may include a composite section 109 such as an FR4 (flame retardant epoxy resin and glass fabric composite) construction, and an upper substrate section 111 such as a lacquer treatment material 111. In an embodiment, electrical coupling structures such as an electrical foil material 107 is co-planar with the upper substrate section 111, for making electrical connections in a patterned relationship with the upper substrate section 111. The "electrical foil material" such as the electrical foil material 107 may be so designated as it may be derived from a foil material that is placed and patterned during the build-up lamination process to form the build-up lamination assembly 110 of the printed wiring board assembly 100. As illustrated, the electrical foil material 107 may have been patterned and the upper substrate section 111 may have been filled among patterning such that the electrical foil material 107 forms contacts for recessed contact pads 122 and 124 as further described herein.

The build-up lamination assembly 110 includes a recess 112 that may be formed in a material that forms a solder-resist section 113, where the solder-resist section 113 in part defines a first surface 114 and the recess 112 includes a recess terminus 116 (also referred to herein as a "recess floor" or a "lower vertical boundary"). The recess 112 also includes a first wall 118 (also referred to herein as a "first horizontal boundary") and a second wall 120 (also referred to herein as a "second horizontal boundary"), where the respective first wall and second wall 118 and 120 are substantially orthogonal to the recess floor 116. As illustrated in an embodiment, the first wall 118 and the second wall 120 are defined at boundaries by the solder-resist section 113. The second wall 120 may be spaced apart (e.g., horizontally offset from) and opposite the first wall 118. Formation of the first recessed contact pad 122 and the second recessed contact pad 124 may include patterning a mask, that covers both the first surface 114 and over portions of the recess terminus 116, followed by deposition of metallic material such as by chemical vapor deposition (CVD). In an embodiment, a seed material is deposited in essentially the form factor of the first and second contact pads 122 and 124, followed by electrodeposition of the first recessed contact pad 122 and the second recessed contact pad 124, that use the seed material as a cathode source. The Z form factors that are the first recessed contact pad 122 and the second recessed contact pad 124, are deposited, followed by removing the mask.

The first recessed contact pad 122 (e.g., a "Z-pad," a contact pad with a Z-shaped longitudinal cross section or a backwards-Z-shaped longitudinal cross section) includes a first contact pad first portion 122A (vertical portion 122A) that is substantially within the recess 112 and mostly (e.g., greater than 50 percent) below the first surface 114. The first recessed contact pad 122 may also include a first contact pad second portion 122B that is against the recess terminus 116. The first contact pad second portion 122B may also be referred to as a first contact pad lower portion 122B. As illustrated, the first contact pad second portion 122B is electrically coupled to the electrical foil material 107, which may contact the first contact pad second portion 122B as an exposed portion within the recess 112. The first recessed contact pad 122 may also include first contact pad third portion 122C that is above the first surface 114. The first contact pad third portion 122C may also be referred to as a first contact pad upper portion 122C. In an embodiment, the first contact pad first portion 122A and the first contact pad second portion 122B are an integral structure such as a single (e.g., only one) conductive material such as electronics-grade copper, and a lower transition region 122AB between the first contact pad first portion 122A and the first contact pad second portion 122B, occurs laterally left of the first wall 118 and vertically above the recess terminus 116. In an embodiment, the first contact pad first portion 122A and the first contact pad third portion 122C are an integral structure such as a single conductive material such as electronics-grade copper, and an upper transition region 122AC between the first contact pad first portion 122A and the first contact pad third portion 122C, occurs laterally left of the first wall 118 and vertically above the first surface 114.

Still referring to FIG. 1A, the second recessed contact pad 124 includes a second contact pad first portion 124A (vertical portion 124A) that is substantially within the recess 112. The second recessed contact pad 124 may also include a second contact pad second portion 124B that is against the recess terminus 116. The second contact pad second portion 124B may also be referred to as a second contact pad lower portion 124B. As illustrated, the second contact pad second portion 124B is electrically coupled to the electrical foil material 107, which may contact the second contact pad second portion 124B as an exposed portion within the recess 112. The second recessed contact pad 124 may also include second contact pad third portion 124C that is above the first surface 114. The second contact pad third portion 124C may also be referred to as a second contact pad upper portion 124C. In an embodiment, the second contact pad first portion 124A and the second contact pad second portion 124B are an integral structure such as a single (e.g., only one) conductive material such as electronics-grade copper, and a lower transition region 124AB between the second contact pad first portion 124A and the second contact pad second portion 124B, occurs laterally right of the second wall 120 and vertically above the recess terminus 116. In an embodiment, the second contact pad first portion 124A and the second contact pad third portion 124C are an integral structure such as a single conductive material such as electronics-grade copper, and an upper transition region 124AC between the second contact pad first portion 124A and the second contact pad third portion 124C, occurs laterally right of the second wall 120 and vertically above the first surface 114.

Figure 1B:
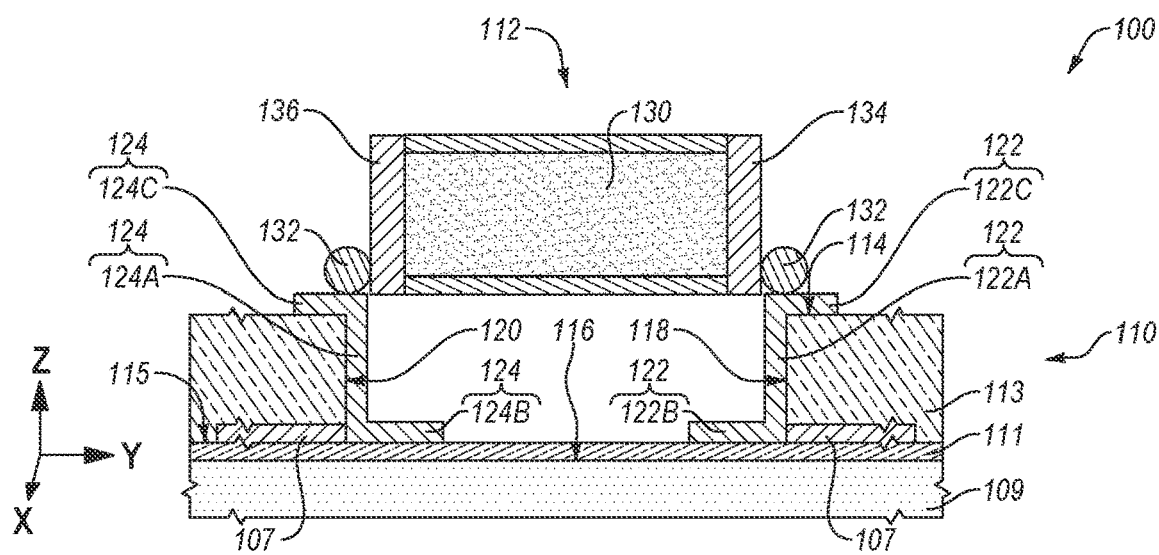
FIG. 1B is a simplified, longitudinal cross-section view of the semiconductor device package substrate assembly of FIG. 1A during a component-assembly stage.

FIG. 1B is a simplified, longitudinal cross-section view of a printed wiring board assembly 100 similar to the printed wiring board assembly of FIG. 1A during a component-assembly stage following the processing stage depicted in FIG. 1A. Additional detail is added in an embodiment, where the electrical contact structure 107 are trace structures 107 that are located embedded in the solder-resist material 113 at an upper boundary level 115 of the upper substrate section 111. The trace structure 107 may also be referred to as a contact plane structure 107, where an electrically conductive metallic foil structure is patterned at the upper boundary level 115, among non-electrically conductive portions of the upper substrate section 111. The trace structure 107 contacts each of the first recessed contact pad 122 and the second recessed contact pad 124. The upper substrate section 111, if present, may be a treatment material such as a lacquer material that may be generally located above and on the composite section 109, where the upper substrate section 111 as a treatment material, may protect otherwise exposed conductive structures during processing, including during forming the solder-resist material 113. As illustrated, the recess terminus 116 has substantially the same vertical location as the upper boundary level 115 of the upper substrate section 111. A component 130 is illustrated centered above the recess 112, and solder precursors 132 are positioned on each of the first contact pad third portion 122C and the second contact pad third portion 124C, as well as against respective first and second component electrodes 134 and 136 of the component 130.

In an embodiment, the component 130 is a passive device such as one of a capacitor, a resistor, an inductor, a balun, or a radio-frequency identification (RFID) tag. In an embodiment, the component 130 is an active device such as a millimeter-wave intra-package communication device, a disaggregated-die active device such as a radio-frequency device, or another active device.

In an embodiment, the solder precursors 132 are pre-attached to the first and second component electrodes 134 and 136. In an embodiment, the solder precursors 132 are pre-attached to the first and second contact pads 122 and 124 at the first and second contact pad upper sections 122C and 124C, respectively. Although the solder precursors 132 are illustrated as circular (solid cylindrical in perspective view), other the solder precursors may be provided in different form factors, such as solid rectangles that substantially match the first and second electrodes 134 and 136 in at least Z-height. Sufficient masses (e.g., volumes, amounts) of the solder precursors 132 are provided such that, during solder-reflow assembly of the component 130 into the recess 112, a useful solder joint 132A (e.g., FIG. 1C) is formed.

Assembly may include inserting the component 130 under a thermal load to allow the solder precursors 132 to begin flow against the first and second electrodes 134 and 136, and by wetting action, solder precursors 132 are pulled into a space between the first contact pad first portion 122A and the first electrode 134, and similarly, solder precursors 132 are pulled into a space between the second contact pad first portion 124A and the second electrode 136. In an embodiment, the respective first and second electrodes 134 and 136 are a metallic material, such that the solder precursor 132 has a higher solder-wetting capability onto the first and second electrodes 134 and 136, than wetting onto the respective first and second contact pads 122 and 124. The metallurgical difference between the contact pads 122 and 124, and the first and second electrodes may be electronically insignificant for power and/or communication uses, but wetting capabilities of the solder precursor 132 onto the first and second electrodes 134 and 136 may be greater than wetting capabilities of the first and second contact pads 122 and 124.

Figure 1C:
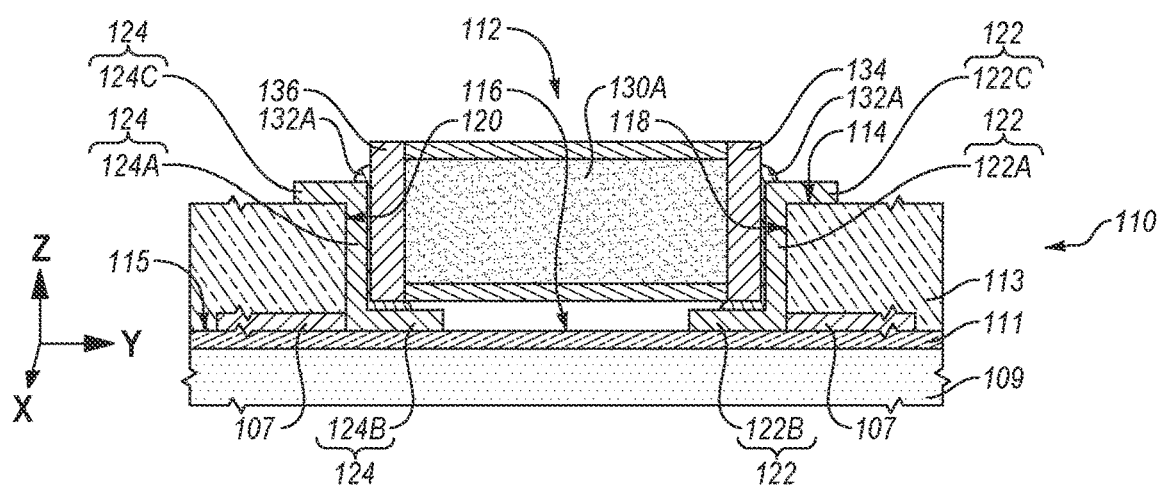
FIG. 1C is a simplified, longitudinal cross-section view of the semiconductor device package assembly of FIG. 1B after the component-assembly stage illustrated in FIG. 1B.

FIG. 1C is a simplified, longitudinal cross-section view of the printed wiring board assembly 100 after the processing stage illustrated in FIG. 1B. The component 130 illustrated in FIG. 1B is an embedded component 130A (embedded component 130A, partially embedded component 130A). As illustrated, vertical upper portions of the embedded component 130A, extend above (positive Z-direction) the first surface 114. The solder precursors 132 are illustrated in FIG. 1B, are solder joints 132A. A first solder joint 132A is seen between substantially all of the first contact pad first portion 122A and the first electrode 134, and a second solder joint 132A is also seen between substantially all of the second contact pad first portion 124A and the second electrode 136. The solder joint 132A that contacts the first contact pad first portion 122A may also contact at least some of the first contact pad second portion 122B. The solder joint 132A that contacts the first contact pad first portion 122A may also contact at least some of the first contact pad third portion 122C. The solder joint 132A that contacts the first contact pad first portion 122A may also contact at least some of the first contact pad second portion 122B as well as at least some of the first contact pad third portion 122C. Similarly, the solder joint 132A that contacts the second contact first portion 124A may also contact at least some of the second contact pad second portion 124B. The solder joint 132A that contacts the second contact first portion 124A may also contact at least some of the second contact pad third portion 124C. The solder joint 132A that contacts the second contact pad first portion 124A may also contact at least some of the second contact pad second portion 124B as well as at least some of the second contact pad third portion 124C.

Figure 2A:
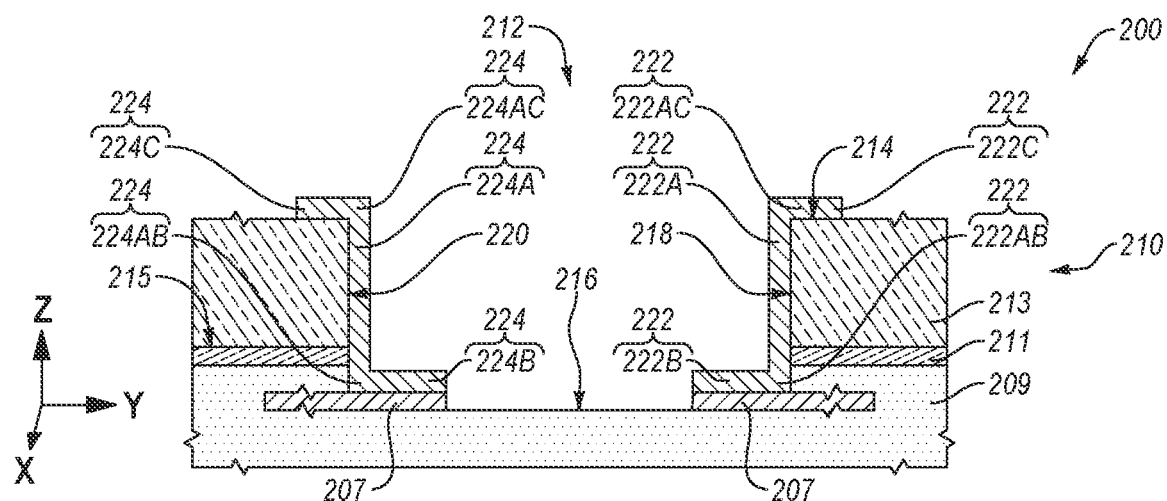
FIG. 2A is simplified, longitudinal cross-section view of portion of a semiconductor device mounting substrate assembly, in accordance with additional embodiments of the disclosure.

FIG. 2A is a simplified, longitudinal cross-section view of a portion of a printed wiring board assembly 200, according to embodiments of the disclosure. A build-up lamination assembly 210 may include a composite section 209 such as an FR4 construction, and an upper substrate section 211 such as a lacquer treatment material 211. The build-up lamination assembly 210 includes a recess 212 that may be formed through a solder-resist section 213, where the solder-resist section 213 in part defines a first surface 214, and the recess 212 includes a recess terminus 216 (recess floor 216, lower vertical boundary 216) that extends at least through the upper substrate section 211, and the recess terminus 216 may also terminate in a portion of the composite section 209. The recess 212 also includes a first wall 218 and a second wall 220, where surfaces of the first wall and the second wall 220 include laterally exposed portions of the solder-resist section 213, the upper substrate section 211, and some of the composite section 209. The second wall 220 may be spaced apart and opposite the first wall 218. A first recessed contact pad 222 (e.g., a "Z-pad," contact pad with a Z-shaped longitudinal cross section or a backwards-Z-shaped longitudinal cross section) includes a first contact pad first portion 222A that is substantially vertically (Z-direction) configured and mostly (e.g., at least 50 percent) within the recess 212 below the first surface 214. An electrical coupling structure 207 such as a trace structure 207 is located embedded below the solder-resist section 213 and the trace structure 207 may be below an upper boundary level 215 of the upper substrate section 211. The trace structure 207 is contacted by each of the first recessed contact pad 222 and the second recessed contact pad 224. The first recessed contact pad 222 may also include a first contact pad second portion 222B that is above and on the level of the recess terminus 216. The first contact pad second portion 222B may also be referred to as a first contact pad lower portion 222B. The first recessed contact pad 222 may also include first contact pad third portion 222C that is above the first surface 214. The first contact pad third portion 222C may also be referred to as a first contact pad upper portion 222C. In an embodiment, the first contact pad first portion 222A and the first contact pad second portion 222B are an integral structure, such as a single (e.g., only one) conductive material such as electronics-grade copper, and a lower transition region 222AB between the first contact pad first portion 222A and the first contact pad second portion 222B, occurs laterally left of the first wall 218 and vertically above the recess terminus 216. In an embodiment, the first contact pad first portion 222A and the first contact pad third portion 222C are an integral structure, such as a single conductive material such as electronics-grade copper, and an upper transition region 222AC between the first contact pad first portion 222A and the first contact pad third portion 222C, occurs laterally left of the first wall 218 and vertically above the first surface 214.

Still referring to FIG. 2A, the second recessed contact pad 224 includes a second contact pad first portion 224A that is substantially vertically (Z-direction) configured and mostly within the recess 212 below the first surface 214. The second recessed contact pad 224 may also include a second contact pad second portion 224B that is above and on the recess terminus 216. The second contact pad second portion 224B may also be referred to as a second contact pad lower portion 224B. The second recessed contact pad 224 may also include second contact pad third portion 224C that is above the first surface 214. The second contact pad third portion 224C may also be referred to as a second contact pad upper portion 224C. In an embodiment, the second contact pad first portion 224A and the second contact pad second portion 224B are an integral structure such as a single conductive material such as electronics-grade copper, and a lower transition region 224AB between the second contact pad first portion 224A and the second contact pad second portion 224B, occurs laterally right of the second wall 220 and vertically above the recess terminus 216. In an embodiment, the second contact pad first portion 224A and the second contact pad third portion 224C are an integral structure such as a single conductive material such as electronics-grade copper, and an upper transition region 224AC between the second contact pad first portion 224A and the second contact pad third portion 224C, occurs laterally right of the second wall 220 and vertically above the first surface 214.

Figure 2B:
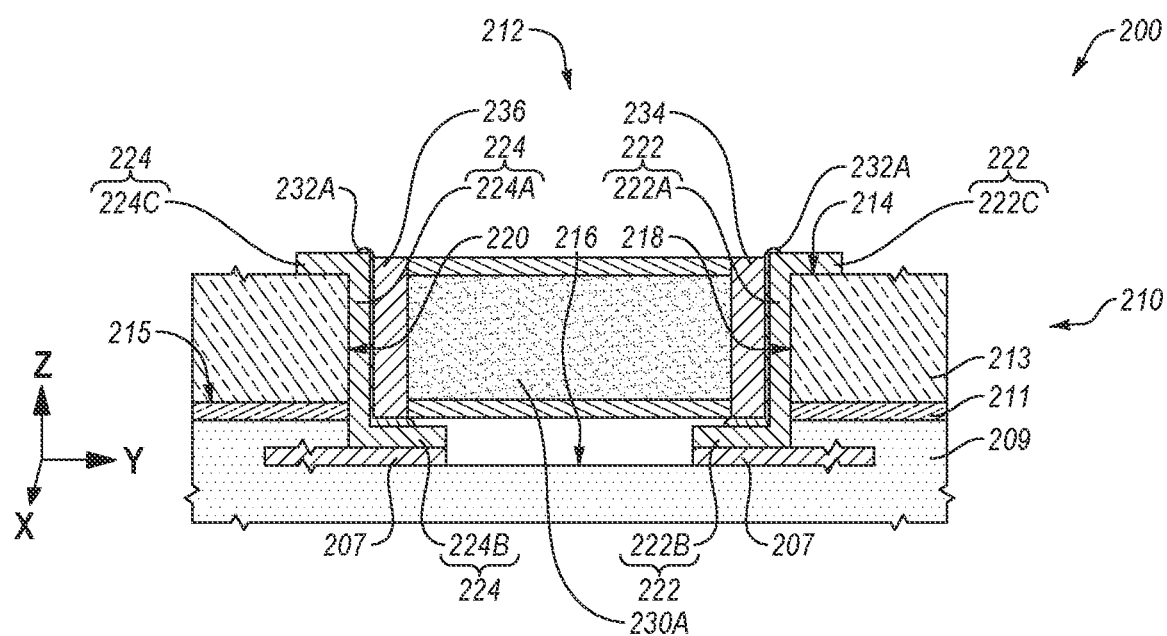
FIG. 2B is simplified, longitudinal cross-section view of the semiconductor device package assembly illustrated in FIG. 2A at a processing stage following that depicted in FIG. 2A.

FIG. 2B is a simplified, longitudinal cross-section view of the printed wiring board assembly 200 illustrated in FIG. 2A after a subsequent processing stage to embed a component. An embedded component 230A has been inserted into the recess 212 and solder joints 232A have been formed between substantially all of the first contact pad first portion 222A and a first electrode 234 of the embedded component 230A, and a solder joint 232A is also seen between substantially all of the second contact pad first portion 224A and a second electrode 236 of the embedded component 230A. The solder joint 232A that contacts the first contact pad first portion 222A may also contact at least some of the first contact pad second portion 222B. The solder joint 232A that contacts the first contact pad first portion 222A may also contact at least some of the first contact pad third portion 222C. The solder joint 232A that contacts the first contact pad first portion 222A may also contact at least some of the first contact pad second portion 222B as well as at least some of the first contact pad third portion 222C. Similarly, the solder joint 232A that contacts the second contact pad first portion 224A may also contact at least some of the second contact pad second portion 224B. The solder joint 232A that contacts the second contact pad first portion 224A may also contact at least some of the second contact pad third portion 224C. The solder joint 232A that contacts the second contact pad first portion 224A may also contact at least some of the second contact pad second portion 224B as well as at least some of the second contact pad third portion 224C. By comparison between assemblies illustrated in FIGS. 1C and 2B, where the embedded components 130A (FIG. 1C) and 230A may be substantially the same size (Z-height), the embedded component 230A in FIG. 2B has a lower overall Z-profile with respect to the upper surface 214 because the recess 212 is comparatively deeper than the recess 112 (FIG. 1C). Similarly, the solder joints 232A may make contact with a greater portion of the first and second electrodes 234 and 236 in the assembly in FIG. 2A, than that of first and second electrodes 134 and 136 depicted in FIG. 1C.

Figure 3A:
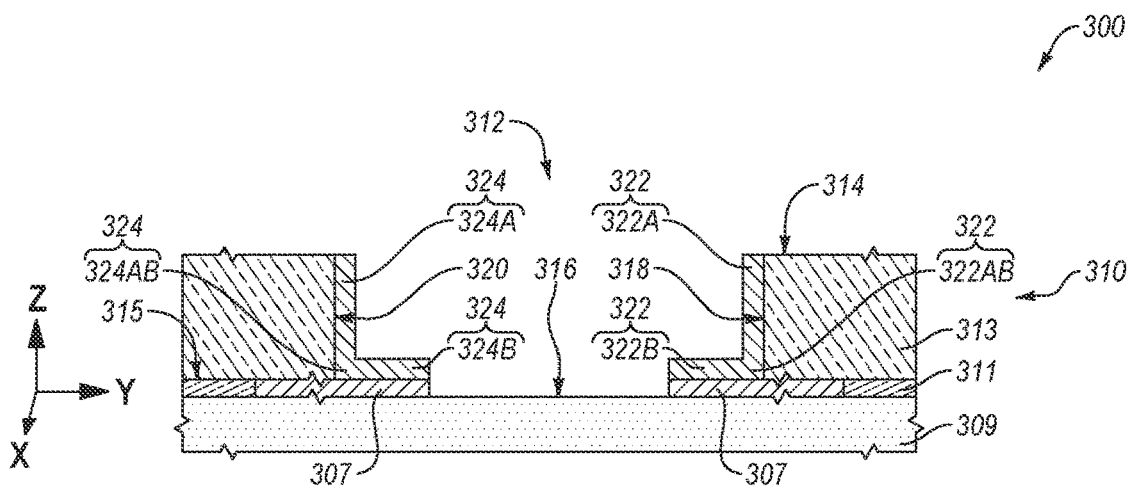
FIG. 3A is simplified, longitudinal cross-section view of a portion of a semiconductor device mounting substrate assembly, in accordance with further embodiments of the disclosure.

FIG. 3A is a simplified, longitudinal cross-section view of a portion of a printed wiring board assembly 300, according to embodiments of the disclosure. The printed wiring board assembly 300 may be part of a motherboard. The printed wiring board assembly 300 may be part of a package board. The printed wiring board assembly 300 may be part of a memory-module board such as for an array of DRAMs. A build-up lamination assembly 310 may include a composite section 309 such as an FR4 construction, and an upper substrate section 311 such as a lacquer treatment material. The build-up lamination assembly 310 includes a recess 312 that may be formed in a solder-resist section 313, where the solder-resist section 313 in part defines a first surface 314 and the recess 312 includes a recess terminus 316. The recess 312 also includes a first wall 318 and a second wall 320. The second wall 320 may be spaced apart and opposite the first wall 318. A first recessed contact pad 322 (e.g., an "L-pad," a contact pad with an L-shaped longitudinal cross-section or a backwards L-shaped longitudinal cross-section) includes a first contact pad first portion 322A that is substantially within the recess 312 below the first surface 314. The first recessed contact pad 322 may also include a first contact pad second portion 322B that is proximate and above the recess terminus 116, and an electrical coupling structure such as a trace structure 307 is above and on the recess terminus 116, and the first contact pad second portion 322B is above and on a portion of the trace structure 307 that extends within the recess 312. In an embodiment, the first recessed contact pad 322 is against the recess terminus 316 such as that illustrated in FIG. 1A. As illustrated in FIG. 3A, however, the trace structure 307 may occupy at least a portion of the vertical displacement of the upper substrate section 311 if the upper substrate section 311 is present, and each of the trace structure 307 and the upper substrate section 311 may have a common upper boundary 315 below the solder-resist section 313. The first contact pad second portion 322B may also be referred to as a first contact pad lower portion 322B. In an embodiment, the first contact pad first portion 322A and the first contact pad second portion 322B are an integral structure such as a single conductive material such as electronics-grade copper, and a lower transition region 322AB between the first contact pad first portion 322A and the first contact pad second portion 322B, occurs laterally left of the first wall 318 and vertically above the recess terminus 316.

Still referring to FIG. 3A, the second recessed contact pad 324 includes a second contact pad first portion 324A that is substantially within the recess 312. The second recessed contact pad 324 may also include a second contact pad second portion 324B that is proximate and above the recess terminus 316, and the trace structure 307 is above and on the recess terminus 316, and the first contact pad second portion 322B is above and on a portion of the trace structure 307 that extends within the recess 312. In an embodiment, the second recessed contact pad 324 is against the recess terminus 316 such as that illustrated in FIG. 1A. The second contact pad second portion 324B may also be referred to as a second contact pad lower portion 324B. In an embodiment, the second contact pad first portion 324A and the second contact pad second portion 324B are an integral structure such as a single conductive material such as electronics-grade copper, and a lower transition region 324AB between the second contact pad first portion 324A and the second contact pad second portion 324B, occurs laterally right of the second wall 320 and vertically above the recess terminus 116.

Figure 3B:
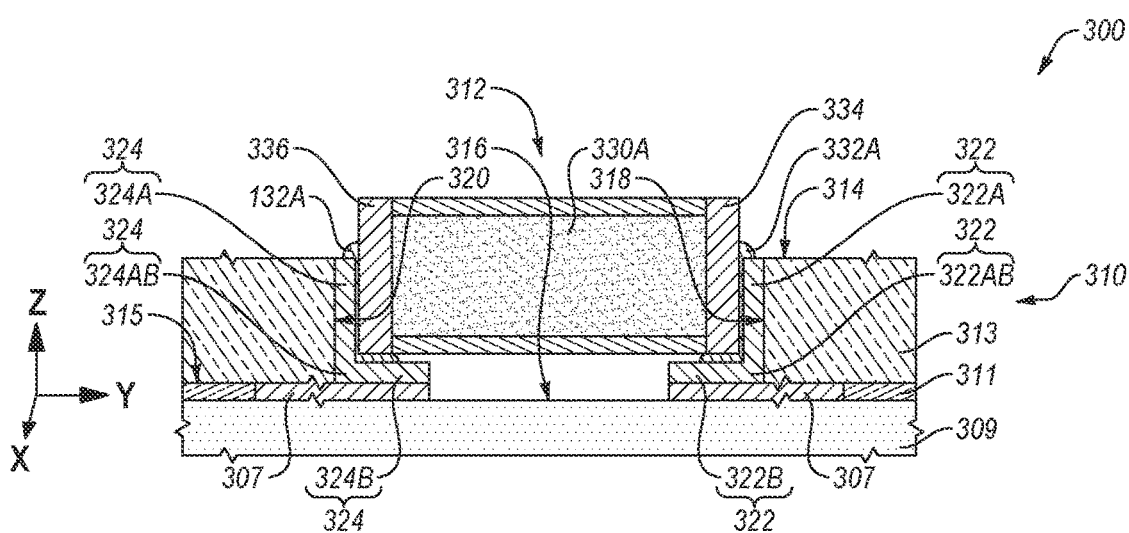
FIG. 3B is a simplified, longitudinal cross-section view of the semiconductor device mounting substrate assembly illustrated in FIG. 3A at a processing stage following that depicted in FIG. 3A.

FIG. 3B is a simplified, longitudinal cross-section view of the printed wiring board assembly 300 illustrated in FIG. 3A after a processing stage to insert an embedded component 330A. As illustrated, vertical upper portions of the embedded component 330A, extend above (positive Z-direction) the first surface 314, the first and second recessed contact pads 322 and 324 also do not extend above the first surface 314. Solder joints 332A are formed from solder precursors 132 (e.g., FIG. 1B). A solder joint 332A is seen between substantially all of the first contact pad first portion 322A and a first electrode 334, and a solder joint 332A is also seen between substantially all of the second contact pad first portion 324A and a second electrode 336. The solder joint 332A that contacts the first contact pad first portion 322A may also contact at least some of the first contact pad second portion 322B. Similarly, the solder joint 332A that contacts the second contact pad first portion 324A may also contact at least some of the second contact pad second portion 324B.

Figure 3C:
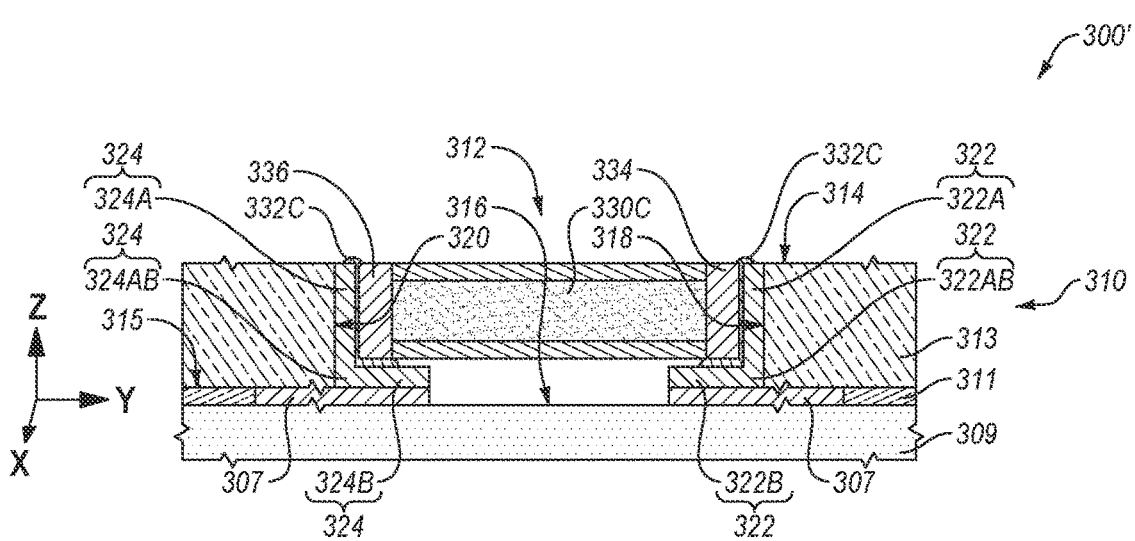
FIG. 3C is a simplified, longitudinal cross-section view of the semiconductor device mounting substrate assembly illustrated in FIG. 3A at a processing stage following that depicted in FIG. 3A.

FIG. 3C is a simplified, longitudinal cross-section view of a printed wiring board assembly 300' after a processing stage to insert an embedded component 330C coupled to a first recessed contact pad 322 and a second recessed contact pad 324. The printed wiring board assembly 300' may have a different configuration than the printed wiring board assembly 300 following the processing stage of FIG. 3B, and may be formed by further processing the printed wiring board assembly 300 illustrated in FIG. 3A. As illustrated, vertical upper portions of the embedded component 330C, do not substantially extend above (positive Z-direction) the first surface 314, for a useful low-profile form factor, nor does the embedded component 330C extend substantially above any part of the first contact pad first portion 322A nor any part of the second contact pad first portion 324A. A solder joint 332C is seen between substantially all of the first contact pad first portion 322A and the first electrode 334, and a solder joint 332C is also seen between substantially all of the second contact pad first portion 324A and the second electrode 336. The solder joint 332C that contacts the first contact pad first portion 322C may also contact at least some of the first contact pad second portion 322B. Similarly, the solder joint 332C that contacts the second contact first portion 324A may also contact at least some of the second contact pad second portion 324B. By use of the embedded component 330C that has a comparatively lower Z-height than an embedded component 130A (e.g., FIG. 1C and FIG. 3B), and by use of L-pad form factor contact pads 322 and 324, substantially no structure materially extends above the first surface 314.

Figure 4:
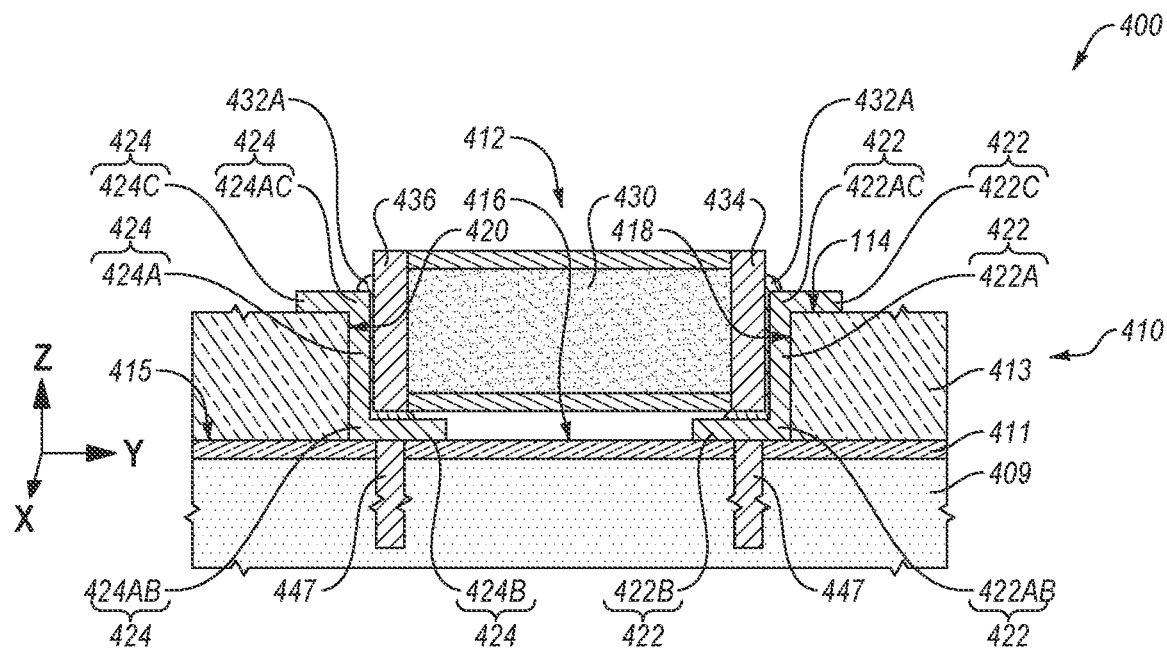
FIG. 4 is a simplified, longitudinal cross-section view a semiconductor device mounting substrate assembly, in accordance with yet further embodiments of the disclosure.

FIG. 4 is a simplified, longitudinal cross-section view of a printed wiring board assembly 400, according to embodiments of the disclosure. A build-up lamination assembly 410 may include a composite section 409 such as an FR4 construction, and an upper substrate section 411 such as a lacquer treatment material 411. The build-up lamination assembly 410 includes a recess 412 that may be formed in a solder-resist section 413, where the solder-resist section 413 in part defines a first surface 414 and the recess 412 includes a recess terminus 416. The recess 412 also includes a first wall 418 and a second wall 420. The second wall 420 may be spaced apart and opposite the first wall 418. A first recessed contact pad 422 (e.g., a "Z-pad," a contact pad with a Z-shaped longitudinal cross-section or a backwards-Z-shaped longitudinal cross-section) includes a first contact pad first portion 422A that is substantially within the recess 412 below the first surface 414. The first recessed contact pad 422 may also include a first contact pad second portion 422B that is against the recess terminus 416 (recess floor 416). The first contact pad second portion 422B may also be referred to as a first contact pad lower portion 422B. The first recessed contact pad 422 may also include first contact pad third portion 422C that is above the first surface 414. The first contact pad third portion 422C may also be referred to as a first contact pad upper portion 422C. In an embodiment, the first contact pad first portion 422A and the first contact pad second portion 422B are an integral structure such as a single conductive material such as electronics-grade copper, and a lower transition region 422AB between the first contact pad first portion 422A and the first contact pad second portion 422B, occurs laterally left of the first wall 418 and vertically above the recess terminus 416. In an embodiment, the first contact pad first portion 422A and the first contact pad third portion 422C are an integral structure such as a single conductive material such as electronics-grade copper, and an upper transition region 422AC between the first contact pad first portion 422A and the first contact pad third portion 422C, occurs laterally left of the first wall 418 and vertically above the first surface 414.

Still referring to FIG. 4, the second recessed contact pad 424 includes a second contact pad first portion 424A that is substantially within the recess 412. The second recessed contact pad 424 may also include a second contact pad second portion 424B that is against the recess terminus 416. The second contact pad second portion 424B may also be referred to as a second contact pad lower portion 424B. The second recessed contact pad 424 may also include second contact pad third portion 424C that is above the first surface 414. The second contact pad third portion 424C may also be referred to as a second contact pad upper portion 424C. In an embodiment, the second contact pad first portion 424A and the second contact pad second portion 424B are an integral structure such as a single conductive material such as electronics-grade copper, and a lower transition region 424AB between the second contact pad first portion 424A and the second contact pad second portion 424B, occurs laterally right of the second wall 420 and vertically above the recess terminus 416. In an embodiment, the second contact pad first portion 424A and the second contact pad third portion 424C are an integral structure such as a single conductive material such as electronics-grade copper, and an upper transition region 424AC between the second contact pad first portion 424A and the second contact pad third portion 424C, occurs laterally right of the second wall 420 and vertically above the first surface 414.

Still referring to FIG. 4, electrical coupling structures such as substrate vias 447 within the composite section 409 of the build-up lamination assembly 410, may include a extend to a boundary level that may be shared by the upper substrate section 411, where the substrate vias 447 each may have a substantially vertical (Z-direction) form factor, and where the substrate vias 447 make electrical contact with each of the first recessed contact pad 422 and the second recessed contact pad 424. As illustrated, electrical connection with each of the first recessed contact pad 422 and the second recessed contact pad 424, may be useful where the recess 412 may not have electrical connections located at or near the plane of the upper substrate section 411, but electrical connection to a component 430 may still be achieved, where the component 430 may be at least partially embedded within the printed wiring board assembly 400 and at least partially below the first surface 414. It may now be understood that an L form-factor first and second contact pad, such as the respective first and second contact pads 322 and 324 (FIGS. 3A through 3C) may be assembled within the printed wiring board assembly 400, in place of the Z form-factor first and second contact pads 422 and 424, respectively. Further, it may now be understood that a component may be assembled to the printed wiring board assembly 400 that has a lower Z-height, such as the embedded component 330C illustrated in FIG. 3C, along with L form-factor first and second contact pads, such as the respective first and second contact pads 322 and 324 (FIGS. 3A through 3C). It may now be understood the electrical contact structure 447 that are via structures 447 that may be described as vertical electrical contact structures 447. By contrast the several illustrated and described electrical contact structures 107, 207, 307, 507, 607, 807, 907, 1007 and 1107 may be described as horizontal electrical contact structures.

Figure 5:
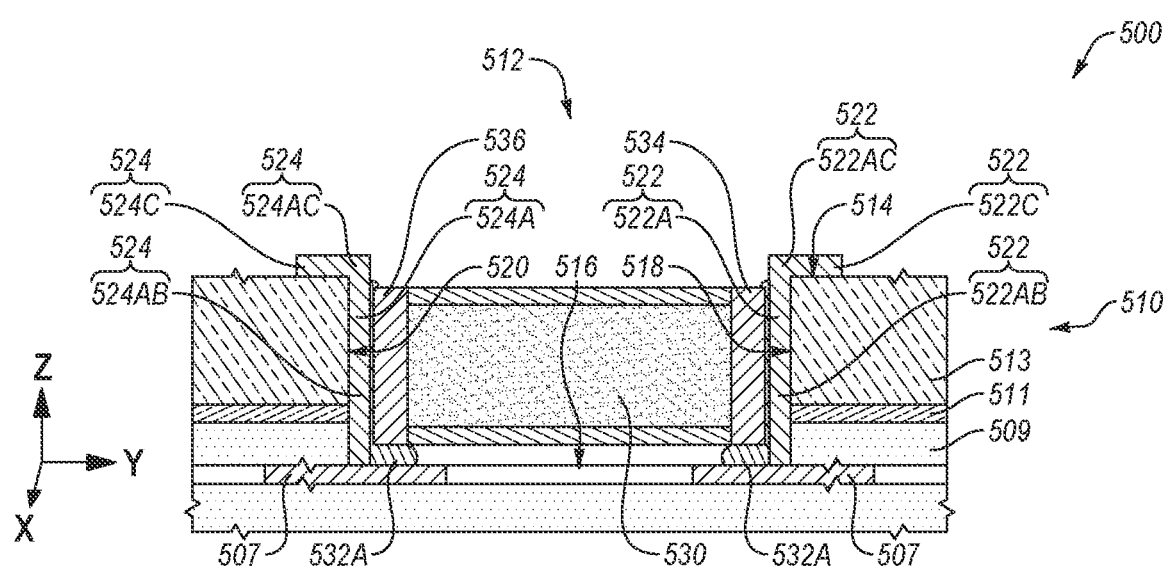
FIG. 5 is a simplified, longitudinal cross-section view a semiconductor device mounting substrate assembly, in accordance with yet still further embodiments of the disclosure.

FIG. 5 is a simplified, longitudinal cross-section view of a printed wiring board assembly 500 with an embedded component, according to embodiments of the disclosure. A build-up lamination assembly 510 may include a composite section 509 such as an FR4 construction, and an upper substrate section 511. A first recessed contact pad 522 (e.g., a Greek-letter Gamma (Γ) pad 522, a contact pad with a "Gamma" (Γ)-shaped longitudinal cross-section or a backwards "Gamma" (Γ)-shaped longitudinal cross-section) includes a first contact pad first portion 522A that is substantially within the recess 512 below the first surface 514. The first recessed contact pad 522 may also include a first contact pad upper portion 522C. In an embodiment, the first contact pad first portion 522A and the first contact pad upper portion 522C are an integral structure such as a single conductive material such as electronics-grade copper, and an upper transition region 522AC between the first contact pad first portion 522A and the first contact pad upper portion 522C, occurs laterally left of the first wall 518 and vertically above the first surface 514.

Still referring to FIG. 5, the second recessed contact pad 524 includes a second contact pad first portion 524A that is substantially within the recess 512. The second recessed contact pad 524 may also include a second contact pad upper portion 424C that is above the first surface 514. In an embodiment, the second contact pad first portion 524A and the second contact pad upper portion 524C are an integral structure such as a single conductive material such as electronics-grade copper, and an upper transition region 524AC between the second contact pad first portion 524A and the second contact pad upper portion 524C, occurs laterally right of the second wall 520 and vertically above the first surface 514.

An electrical coupling structure such as a trace structure 507 is located within the composite section 509 such as below the upper substrate section 511, where the trace structure 507 may be formed of a patterned electrically conductive foil during build-up assembly of the composite section 509. The trace structure 507 may be contacted by each of a first recessed contact pad 522 and the second recessed contact pad 524, and during assembly of a component 530 into a recess 512 where the trace structure 507 is exposed at a recess terminus 516 (recess floor 516), a solder joint 532A makes electrical contact among each of the first recessed contact pad 522, the trace structure 507, and a first electrode 534 of the component 530. Similarly, a solder joint 532A makes electrical contact among each of the second recessed contact pad 524, the trace structure 507, and a second electrode 536 of the component 530. For the first recessed contact pad 522, selection of an amount of solder precursor material (e.g., 132 in FIG. 1B) is made to effectively create three-way contact of the solder joint 532A among the first recessed contact pad 522, the underlying exposed trace structure 507, and the first electrode 534. Similarly for the second recessed contact pad 524, selection of an amount of solder precursor material (e.g., 132 in FIG. 1B) is made to effectively create three-way contact of the solder joint 532A among the second recessed contact pad 524, the underlying exposed trace structure 507, and the second electrode 536.

It may now be understood by reference to FIG. 5, where sufficient surface area of the trace structures 507 is exposed within the recess 512, no recessed contact pads are present, such as the Gamma-shaped first and second recessed contact pads 522 and 524, and sufficient solder precursor material (e.g., item 632 in FIG. 6 or item 732 in FIG. 7) may be provided such that under thermal reflow conditions onto respective first and second electrodes (e.g., items 634 and 636 in FIG. 6) that a useful electrical coupling is achieved by a solder joint solely between a given exposed trace structure and corresponding component electrodes.

Figure 6A:
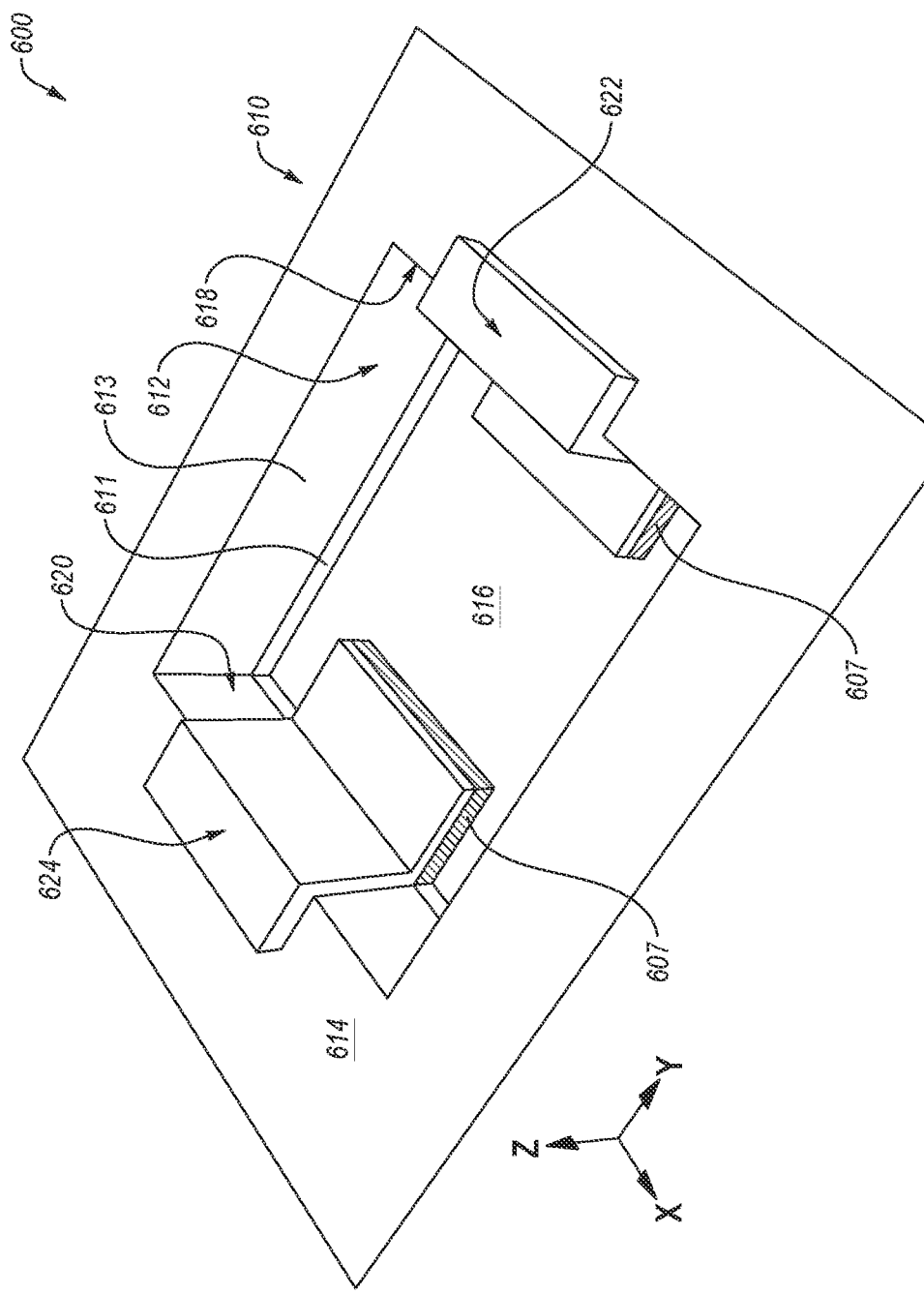
FIG. 6A is a simplified, perspective, partial top view of a portion of a semiconductor device mounting substrate assembly, according embodiments of the disclosure.

FIG. 6A is a simplified, perspective, partial top view of a portion of a printed wiring board assembly 600, according to embodiments of the disclosure. The printed wiring board assembly 600 may be part of a motherboard. The printed wiring board assembly 600 may be part of a package board. The printed wiring board assembly 600 may be part of a memory-module board such as for an array of DRAMs. A build-up lamination assembly 610 may include a composite section (e.g., composite section 109 in FIG. 1A) such as an FR4 construction. The build-up lamination assembly 610 includes a recess 612 that may be formed in a solder-resist section 613, where the solder-resist section 613 in part defines a first surface 614 and the recess 612 includes a recess terminus 616 (recess floor 616). The recess 612 also includes a first wall 618 and a second wall 620. The second wall 620 may be spaced apart and opposite the first wall 618 in the Y-direction. Processing to open the recess 612 may include photolithography, first by patterning the solder-resist section 613. Such processing may open the recess 612 to expose electrical coupling structures such as trace structures 607 that may be coplanar with an upper substrate section 611, such that processing leaves the trace structures 607 at least partially higher (Z-direction) than the recess terminus 616. A first recessed contact pad 622 (e.g., a "Z-pad," a contact pad with a Z-shaped longitudinal cross section or a backwards-Z-shaped longitudinal cross section) is formed on the first surface 614, against the first wall 618 within the recess 612 and upon the trace structure 607. Similarly, a second recessed contact pad 624 is formed on the first surface, against the second wall 620 within the recess 612 and upon the trace structure 607. The configuration of the first and second contact pads 622 and 624 upon trace structures 607 is similar to the configuration of the contact pads 322 and 324 upon trace structures 307 as illustrated in FIG. 3A, with the difference being the contact pads 322 and 324 in FIG. 3A are "L" contact pads. As illustrated throughout this disclosure and particularly in FIG. 6A, a surface area is created, as illustrated with any of the "Z," "L," and "T" shaped pads 622 and 624, a technical effect is to provide a large electrical contact to the component (e.g., component 630 in FIG. 6B). Further, the placement of the component 630 into the recess 612, increases the physical connection between the component 630 and the printed wire bond assembly 600.

Figure 6B:
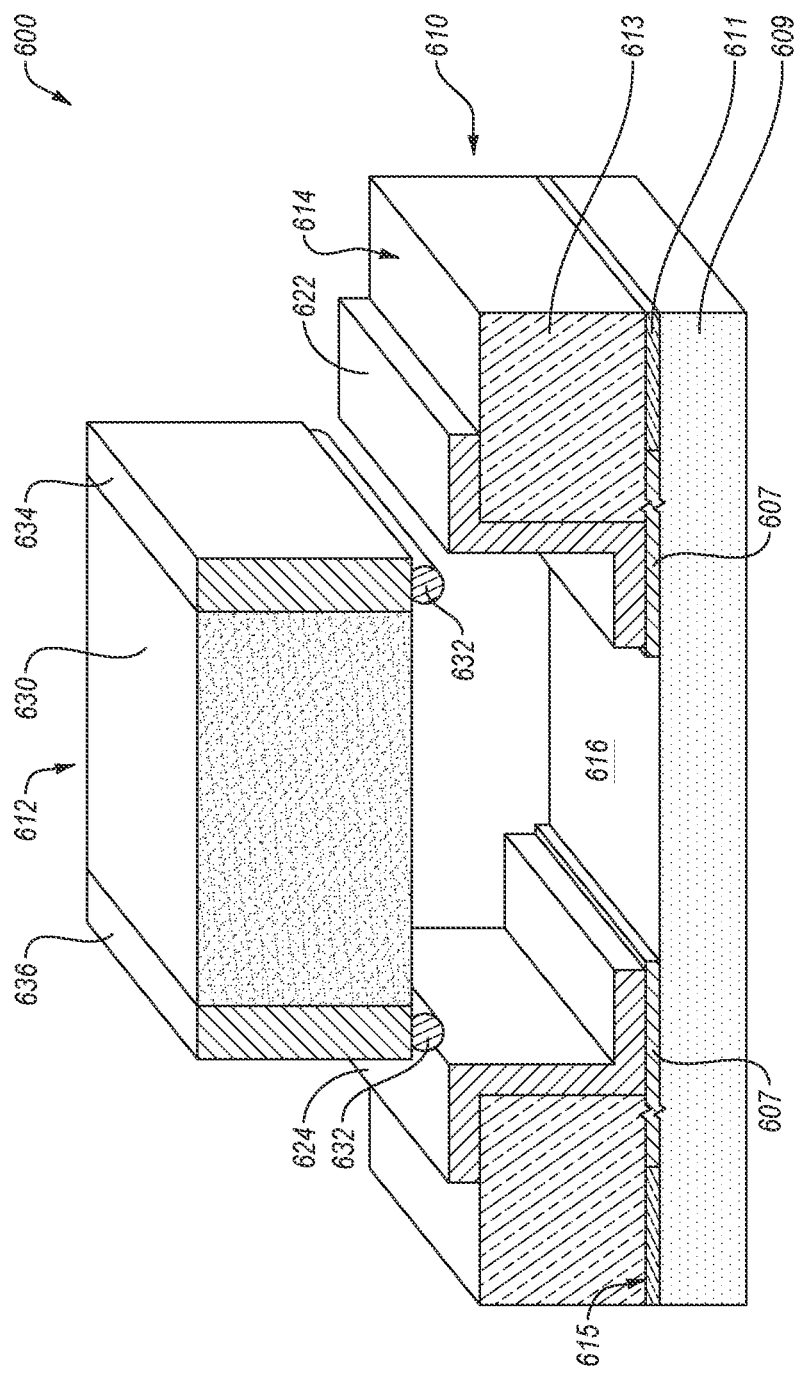
FIG. 6B is a simplified, elevational perspective view of a portion of the semiconductor device mounting substrate assembly illustrated in FIG. 6A during assembly of a component, according to embodiments of the disclosure.

FIG. 6B is a simplified, elevational perspective view of a portion of the printed wiring board assembly 600 illustrated in FIG. 6A during assembly of a component 630, according to embodiments of the disclosure. Solder precursors 632 are pre-attached to the respective first and second component electrodes 634 and 636, and in an embodiment, thermal compression bonding is done to heat the solder precursors 632 while inserting the component 630 into the recess, where the solder precursors 632 will reflow between the respective first and second electrodes 624 and 636 and against the first recessed contact pad 622 and against the second recessed contact pad 624. Where the solder precursors 632 are illustrated as solid-cylinder structures, other form factors may be used such as tetragonal solid structures.

Figure 7:
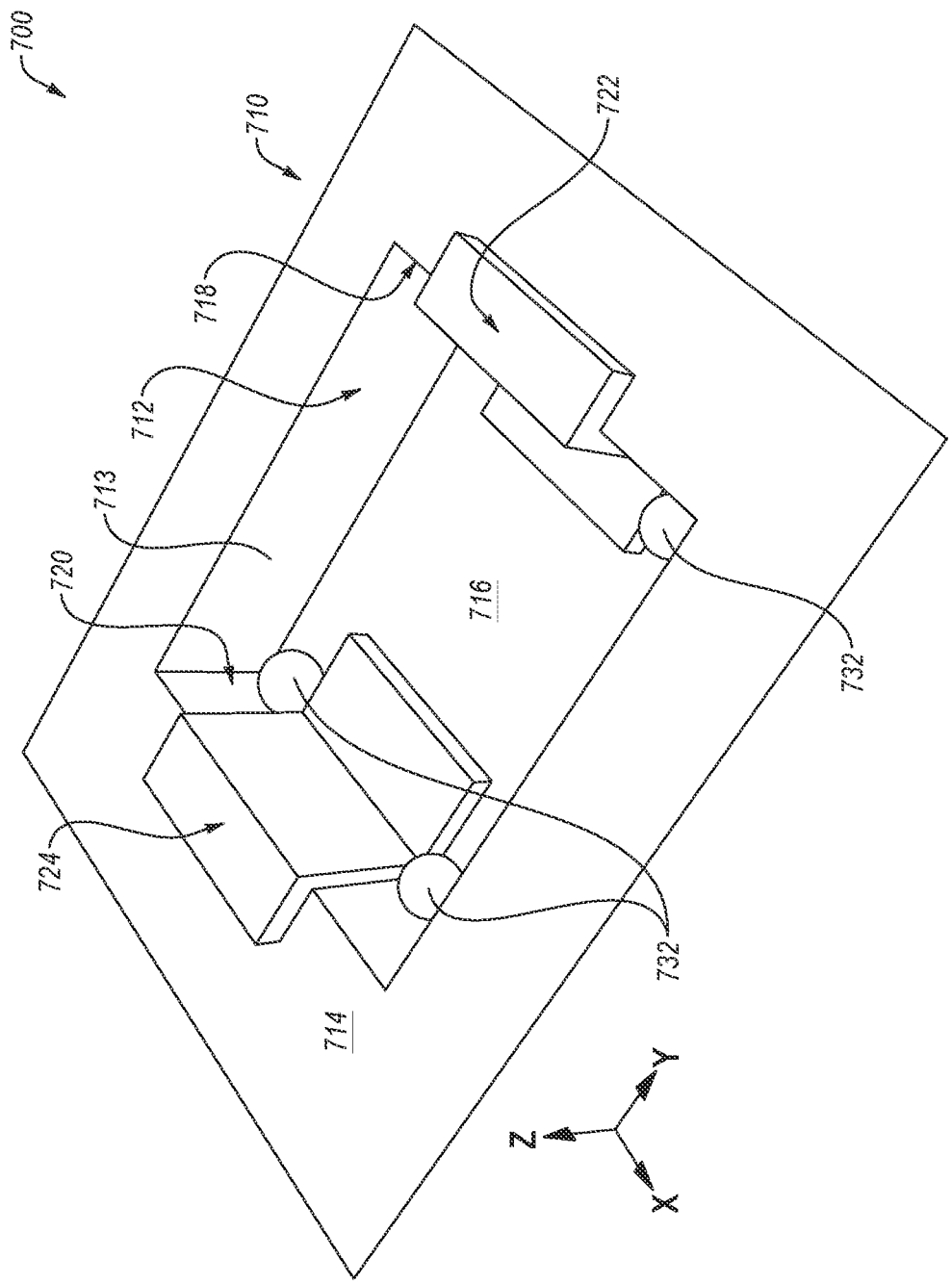
FIG. 7 is a simplified, perspective, partial top view of a portion of a semiconductor device mounting substrate assembly, according to additional embodiments of the disclosure.

FIG. 7 is a simplified, perspective, partial top view of a portion of a printed wiring board assembly 700, according to embodiments of the disclosure. The printed wiring board assembly 700 may be part of a motherboard. The printed wiring board assembly 700 may be part of a package board. The printed wiring board assembly 700 may be part of a memory-module board such as for an array of DRAMs. A build-up lamination assembly 710 may include a composite section (e.g., composite section 109 in FIG. 1A) such as an FR4 construction. The build-up lamination assembly 710 includes a recess 712 that may be formed in a solder-resist section 713, where the solder-resist section 713 in part defines a first surface 714 and the recess 712 includes a recess terminus 716 (recess floor 716). The recess 712 also includes a first wall 718 and a second wall 720. The second wall 720 may be spaced apart and opposite the first wall 718 in the Y-direction. A first recessed contact pad 722 has been formed on the first surface 714, against the first wall 718 within the recess 712, between the first surface 714 and a recess floor 716 within the recess 712. Similarly, a second recessed contact pad 724 has been formed on the first surface 714, against the second wall 720 within the recess 712, between the first surface and the recess floor 716 within the recess 712. Electrical coupling structure such as trace structures (e.g., the electrocoupling structure 607 in FIG. 6A) are not illustrated, and the electrocoupling structures may be configured to contact the first and second contact pads 722 and 724 according to any embodiment set forth in this disclosure.

Preparation of the printed wiring board assembly 700, to receive a component (not illustrated) into the recess 712 onto the respective first and second recessed contact pads 722 and 724, may include pre-placing solder precursors 732, such as spherical solder precursors 732 at or upon the recess terminus 716, and near or contacting lateral aspects of the respective first and second recessed contact pads 722 and 724. During assembly of a component (not illustrated), component electrodes (e.g., electrodes 634 and 636 in FIG. 6A) may contact the solder precursors 732 under thermal reflow conditions such that the solder precursors 732 reflow onto the respective first and second recessed contact pads 722 and 724, and onto the electrodes of the component to form solder joints.

Figure 8:
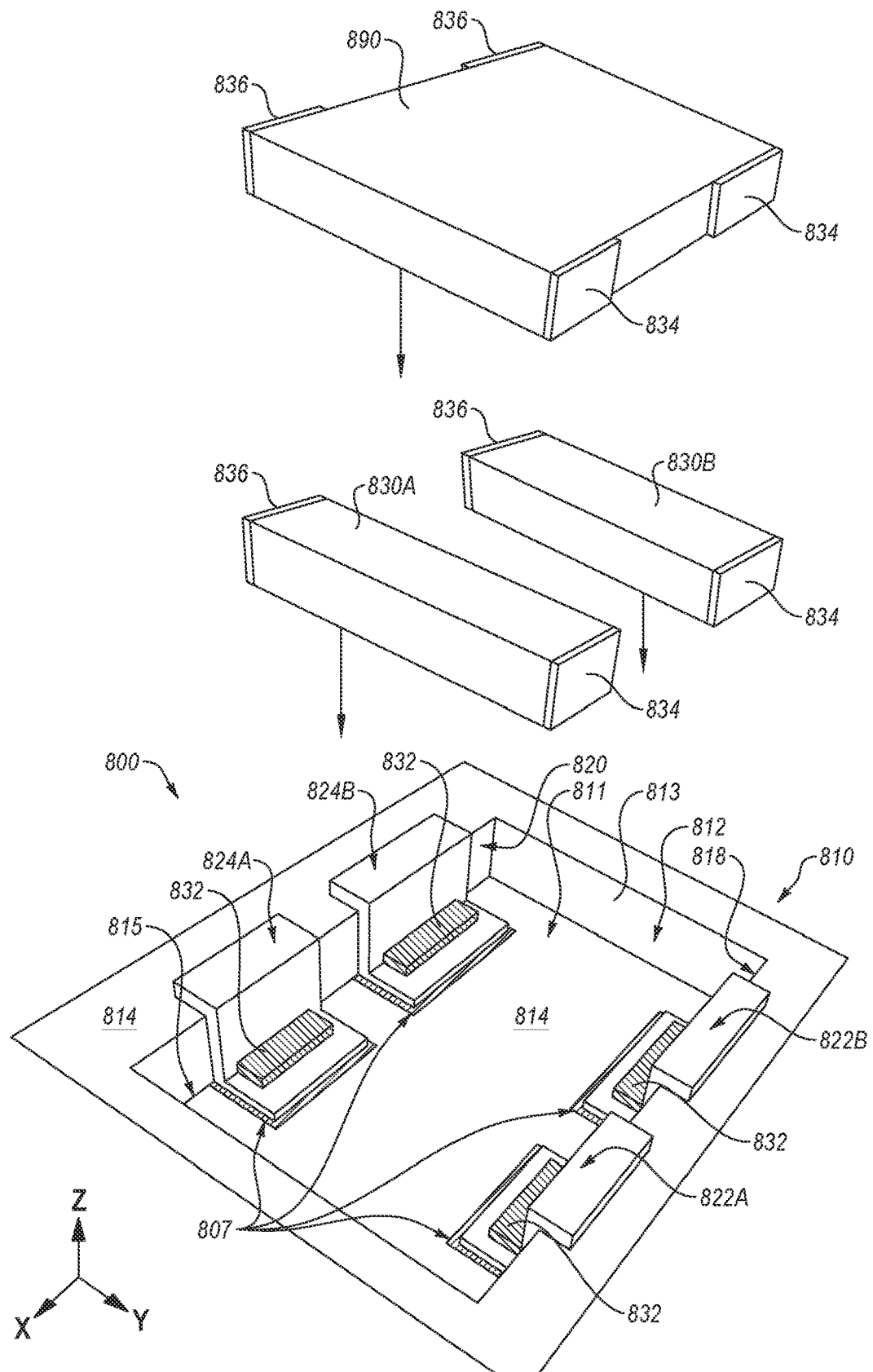
FIG. 8 is a simplified, perspective, partial top view of a portion of a semiconductor device mounting substrate assembly, according to further embodiments of the disclosure.

FIG. 8 includes a simplified, perspective, partial top view of a portion of a printed wiring board assembly 800 with selected components to be partially embedded, according to embodiments of the disclosure. The printed wiring board assembly 800 may be part of a motherboard. The printed wiring board assembly 800 may be part of a package board. The printed wiring board assembly 800 may be part of a memory-module board such as for an array of DRAMs. A build-up lamination assembly 810 may include a composite section (e.g., composite section 109 in FIG. 1A) such as an FR4 construction. The build-up lamination assembly 810 includes a recess 812 that may be formed in a solder-resist section 813, where the solder-resist section 813 in part defines a first surface 814 and the recess 812 includes a recess terminus 816 (recess floor 816). The recess 812 also includes a first wall 818 and a second wall 820. The second wall 820 may be spaced apart and opposite the first wall 818 in the Y-direction. Processing to open the recess 812 may include photolithography, first by patterning the solder-resist section 813. Such processing may open the recess 812 to expose electrocoupling structures such as trace structures 807 that may be above an upper substrate section 811, such that processing leaves the trace structures 807 substantially coplanar with an upper boundary level 815 of the upper substrate section 811, where the upper boundary level 815 and the recess terminus 816 are also substantially coplanar. A first recessed contact first pad 822A and a first recessed contact subsequent pad 822B have been formed on the first surface 814, against the first wall 818 within the recess 812 and upon selected trace structures 807. Similarly, a second recessed contact first pad 824A and a second recessed contact subsequent pad 824B have been formed on the first surface 814, against the second wall 820 within the recess 812 and upon selected trace structures 807. Solder precursors 832 may be pre-positioned upon the contact pads 822A, 822B, 824A and 824B, such as in rhombohedral form factor, in preparation to be reflowed against the contact pads 822 and 824 and first and second electrodes 834 and 836 of respective first and subsequent components 830A and 830B. As illustrated, the first and subsequent components 830A and 830B are being placed into the recess 812 under conditions that the solder precursors 823 reflow against the contact pads 822 and 824 and the electrodes 834 and 836. In an embodiment, "L" form factor contact pads (e.g., FIG. 3A) are used. In an embodiment, Gamma form factor contact pads (e.g., FIG. 4A) are used. The recess 812 may be configured for a single component that requires more than two electrodes, such as for an active microelectronic device component such as a radio-frequency microelectronic device, such as a millimeter-wave intra-microelectronic device radio-frequency communications chip. In an embodiment, a single component 890 having more than two electrodes, is configured to be seated upon the more than two contact pads 822 and 824, where more than two electrodes are required. For example, the single component 890 may be a combination of a passive device such as a radio-frequency identification (RFID) device, with at least one of power and signal electrodes that couple to the recessed contact pads 822 and 824.

Figure 9:
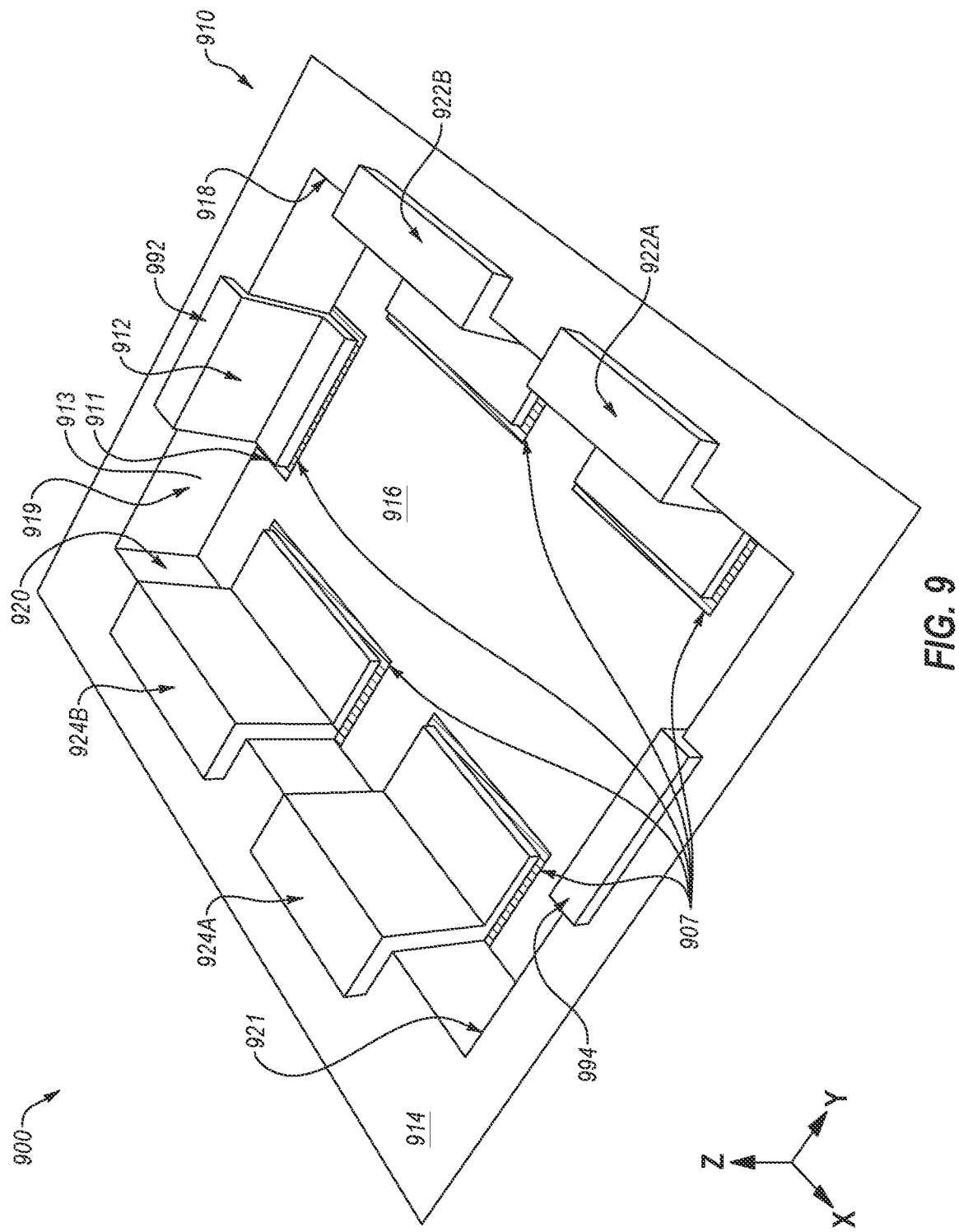
FIG. 9 is a simplified, perspective, partial top view of a portion of a semiconductor device mounting substrate assembly, according to yet further embodiments of the disclosure.

FIG. 9 is a simplified, perspective, partial top view of a portion of a recessed contact pad printed wiring board 900, according to embodiments of the disclosure. The printed wiring board assembly 900 may be part of a motherboard. The printed wiring board assembly 900 may be part of a package board. The printed wiring board assembly 900 may be part of a memory-module board such as for an array of DRAMs. A build-up lamination assembly 910 may include a composite section (e.g., composite section 109 in FIG. 1A) such as an FR4 construction. The build-up lamination assembly 910 includes a recess 912 that may be formed in a solder-resist section 913, where the solder-resist section 913 in part defines a first surface 914 and the recess 912 includes a recess terminus 916 (recess floor 916). The recess 912 also includes a first wall 918 and a second wall 920. The second wall 920 may be spaced apart and opposite the first wall 918 in the Y-direction. A third wall 919 is orthogonal and connecting to the first wall 918 and the second wall 920, and a fourth wall 921 is also orthogonal and connecting to the first wall 918 and the second wall 920, where the third wall 919 may be spaced apart and opposite the fourth wall 921 in the X-direction.

A first recessed contact first pad 922A and a first recessed contact subsequent pad 922B have been formed on the first surface 914, against the first wall 918 within the recess 912 and upon selected electrocoupling structures such as trace structures 907. Similarly, a second recessed contact first pad 924A and a second recessed contact subsequent pad 924B have been formed on the first surface 914, against the second wall 920 within the recess 912 and upon selected trace structures 907. In addition to the recessed contact pads spaced apart and against the respective first and second walls 918 and 920, an orthogonal first recessed contact pad 992 is against the third wall 919, and an orthogonal second recessed contact pad 994 is against the fourth wall 921. The configuration of the several contact recessed pads 922A, 922B, 924A, 924B, 992 and 994, may be provided to make electrical power and communication contact with a component (not illustrated) such as a component that requires more than two electrodes. The configuration of the several contact recessed pads 922A, 922B, 924A, 924B, 992 and 994, and others, may be provided to accommodate a quadrilateral, flat, no-lead (QFN) type recess 916 for a component, whether the component is a passive device, an active device, or a combination thereof.

Figure 10:
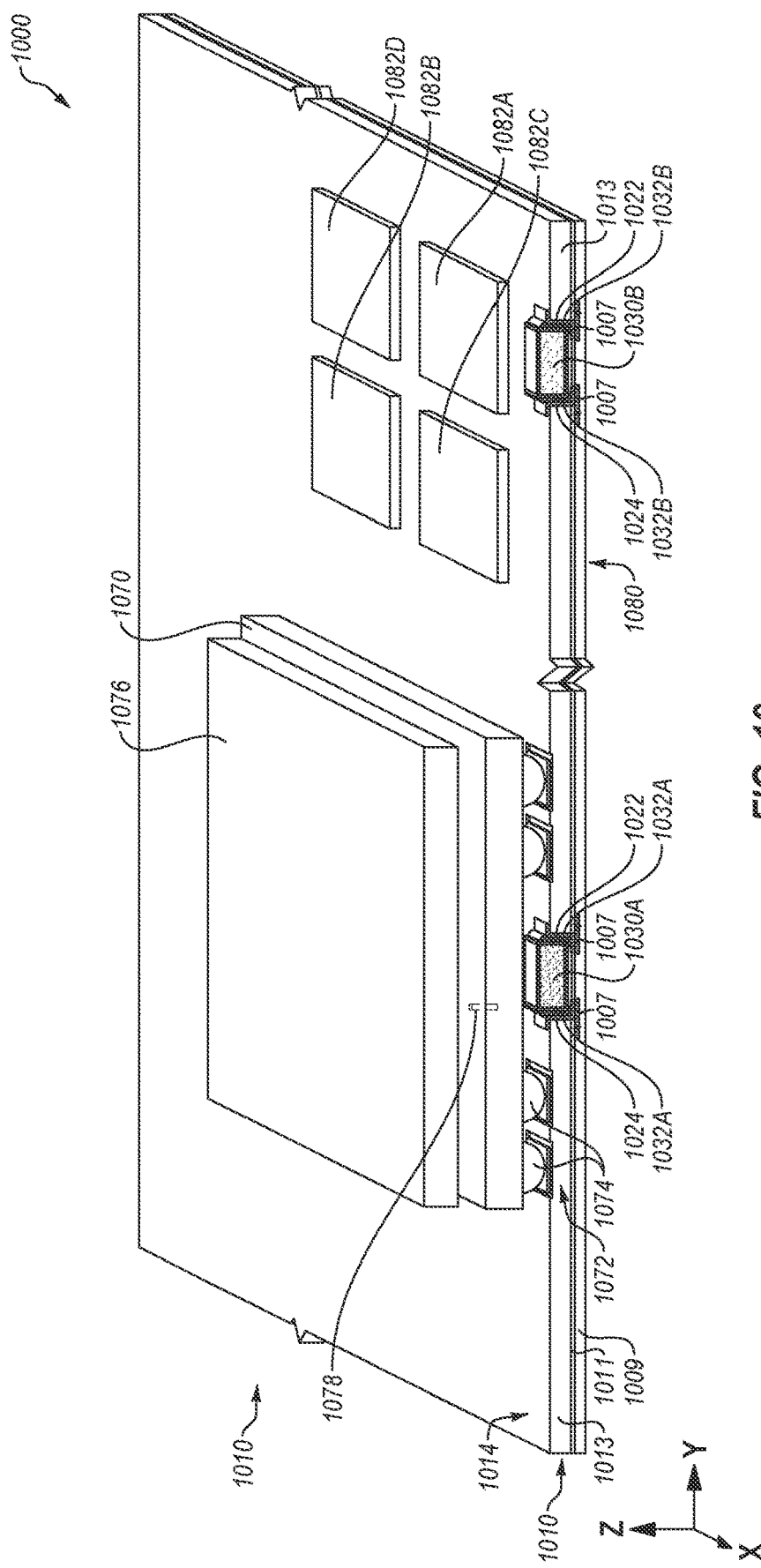
FIG. 10 is simplified, elevational perspective cut away view of a portion of an electronic system, according to s embodiments of the disclosure.

FIG. 10 is a simplified, elevational perspective and partial cut away view of a portion of an electronic system 1000, according to embodiments of the disclosure. A printed wiring board assembly 1010 includes a composite section 1009 such as an FR4 construction, and an upper substrate section 1011 such as a lacquer treatment material 1011. In an embodiment, an electrocoupling structure such as an electrical foil material 1007 may be adjacent and parallel-planar with the upper substrate section 1011, for making electrical connections in a patterned relationship with the upper substrate section 1011. The build-up lamination assembly 1010 includes a solder-resist section 1013, where the solder-resist section 1013 in part defines a first surface 1014. A first embedded component 1030A (first embedded component 1030A, first partially embedded component 1030A) is in the build-up lamination assembly 1010, and is affixed below a first microelectronic device 1070 that is flip-chip mounted through the solder-resist material 1013 to an electrical grid array 1072 by electrical bumps 1074. The first embedded component 1030A may be electrically coupled through trace structures 1007 that are electrically coupled to the first microelectronic device 1070 through a first recessed contact pad 1022 and a second recessed contact pad 1024 by solder joints 1032A. The lowered Z-height of the first embedded component 1030A, allows for locating the first embedded component 1030A to be positioned directly below the first microelectronic device 1070. In an embodiment, the first microelectronic device 1070 is an integrated-circuit device such as a processor device. The first embedded component 1030A may be centrally located within the electrical grid array 1072, where no electrical bumps 1074 populate an area below the first microelectronic device 1070. In an embodiment, a subsequent microelectronic device 1076 is coupled to and above the first microelectronic device 1070, and electrical communication therebetween is accomplished by at least one through-silicon via (TSV) 1078. As illustrated, vertical upper portions of the first embedded component 1030A, extend above (positive Z-direction) the first surface 1014, and still retain a sufficiently low profile to allow ambient fluids, such as heated ambient vapors and gases to be able to pass under the first microelectronic device 1070, above the first surface 1014. Further as illustrated, the first embedded component 1030A, has a footprint below the first microelectronic device 1070, such that a shared footprint exists for each of the first embedded component 1030A and the first microelectronic device 1070. Further, by placing the first embedded component 1030A directly under the first microelectronic device 1070, a routing within the composite section 1009 of the semiconductor device substrate assembly 1001, may present a shorter communications path to e.g., the first microelectronic device 1070.

Still referring to FIG. 10, a microelectronic die array section 1080 of the electronic system 1000 may include several microelectronic devices 1082A, 1082B, 1082C and 1082D, such as a flip-chip DRAM memory die array 1080. A second embedded component 1030B (second embedded component 1030B, second partially embedded component 1030B) may be located proximate the die array 1080, where a Z-height of the second embedded component 1030B is at or below a Z-height of any of the devices of the microelectronic die array section 1080.

Figure 11:
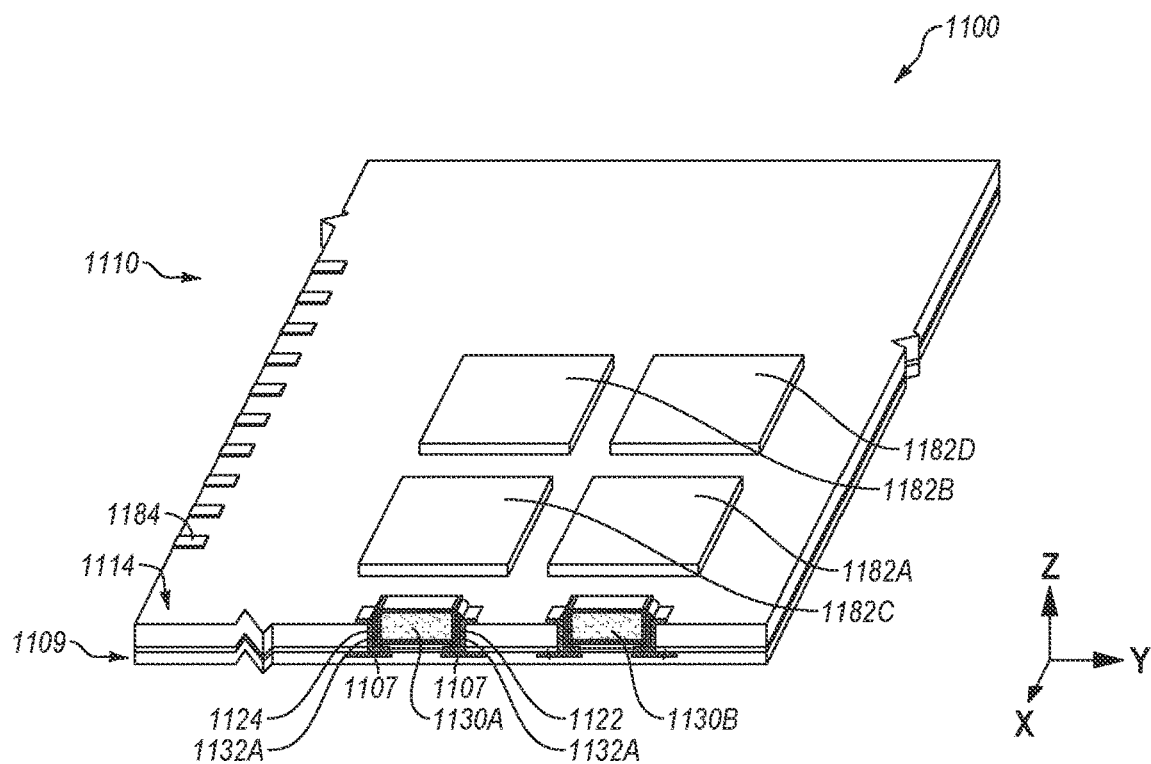
FIG. 11 is simplified, elevational perspective cut away view of a microelectronic device array module, according to embodiments of the disclosure.

FIG. 11 is a simplified, elevational perspective and partial cut away view of a microelectronic device array module 1100, according to embodiments of the disclosure. A printed wiring board assembly 1110 includes a composite section 1109 such as an FR4 construction, and an upper substrate section 1111 such as a lacquer treatment material 1111. In an embodiment, an electrocoupling structure such as an electrical foil material 1107 may be adjacent and parallel-planar with the upper substrate section 1111, for making electrical connections in a patterned relationship with the upper substrate section 1111 and to a first recessed contact pad 1122 and to a second recessed contact pad 1124. The printed wiring board assembly 1110 includes a solder-resist section 1113, where the solder-resist section 1113 in part defines a first surface 1114. A first embedded component 1130A (first embedded component 1130A, first partially embedded component 1130A) and a second embedded component 1130B are in the build-up lamination assembly 1101, and are deployed adjacent several microelectronic devices 1182A, 1182B, 1182C and 1182D, such as a flip-chip DRAM memory die array 1180. Where the microelectronic device array module 1100 may be a memory module such as a dual in-line memory module (DIMM) for a DRAM array, or a single in-line memory module (SIMM) for a DRAM array, the Z-height of the embedded components 1130A and 1130B, do not exceed the Z-height of any of the several microelectronic devices 1182A, 1182B, 1182C and 1182D. A memory module bond finger 1184 may be one of several bond fingers for coupling the microelectronic device array module 1100 to an articulating slot (not illustrated) such as on a laptop computer mother board, where the articulating slot (not illustrated) may be rotated by 90 degrees to present a lowered Z-height commensurate with a laptop computer form factor. Where each of the embedded components 1130A and 1130B have a Z-height that do not exceed the Z-height of any of the several microelectronic devices 1182A, 1182B, 1182C the embedded components, contribute to a laptop form factor.

Figure 12:
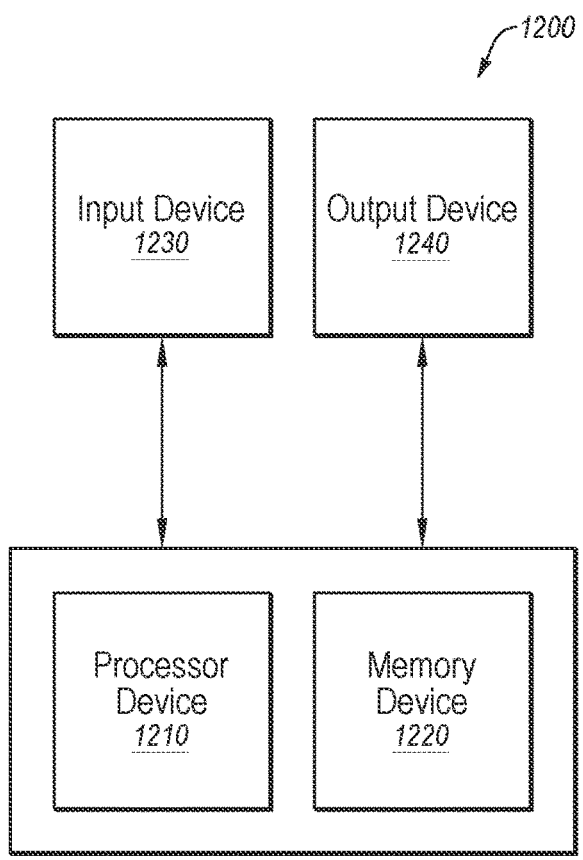
FIG. 12 is a block diagram of an electronic system, according to embodiments of disclosure.

Recessed contact pad printed wiring boards of the disclosure, such as the printed wiring board assemblies 100 (FIG. 1C), 200 (FIG. 2B), 300 (FIG. 3B), 300' (FIG. 3C), 400 (FIG. 4), and 500 (FIG. 5), may be included in embodiments of electronic systems of the disclosure. FIG. 12 is a block diagram of an electronic system 1200, according to embodiments of disclosure. Such an electronic system 1200 may include, for example, one or more of the printed wiring board assemblies 100 (FIG. 1C), 200 (FIG. 2B), 300 (FIG. 3B), 300' (FIG. 3C), 400 (FIG. 4), and 500 (FIG. 5) of the disclosure, which may be included as described and illustrated, in whole or in part, an electronic system 1200. The electronic system 1200 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc., where embodiments of printed wiring board assemblies 100 (FIG. 1C), 200 (FIG. 2B), 300 (FIG. 3B), 300' (FIG. 3C), 400 (FIG. 4), and 500 (FIG. 5) of the disclosure may be employed. The electronic system 1200 includes at least one memory device 1220. The memory device 1220 may include, for example, one or more microelectronic devices that are wire bonded to embodiments of the printed wiring board assemblies 100 (FIG. 1C), 200 (FIG. 2B), 300 (FIG. 3B), 300' (FIG. 3C), 400 (FIG. 4), and 500 (FIG. 5) of the disclosure. The electronic system 1200 may further include at least one electronic signal processor device 1210 (often referred to as a "microprocessor") that is part of an integrated circuit. The electronic signal processor device 1210 may include, for example, one or more of more microelectronic devices that are either wire bonded or flip-chip bonded to embodiments of the printed wiring board assemblies 100 (FIG. 1C), 200 (FIG. 2B), 300 (FIG. 3B), 300' (FIG. 3C), 400 (FIG. 4), and 500 (FIG. 5) of the disclosure. While the memory device 1220 and the electronic signal processor device 1210 are depicted as two (2) separate devices in FIG. 12, in additional embodiments, a single (e.g., only one) memory/processor device having the functionalities of the memory device 1220 and the electronic signal processor device 1210 is included in the electronic system 1200. In such embodiments, the memory/processor device may include, for example, one or more of more microelectronic devices that are either wire bonded or flip-chip bonded to embodiments of the printed wiring board assemblies 100 (FIG. 1C), 200 (FIG. 2B), 300 (FIG. 3B), 300' (FIG. 3C), 400 (FIG. 4), and 500 (FIG. 5) of the disclosure. The processor device 1210 and the memory device 1220 may be part of a central processing unit where the memory device 1220 includes a wire bonded memory device that includes on-die DRAM cache memory. The processor device 1210 and the memory device 1220 may be part of a disaggregated-die, assembly 1210 and 1220 that may also be referred to as a disaggregated-die integrated circuit, including at least one of the processor device 1210 and the memory device 1220 includes more than one of such device in a more-than-two device disaggregated-die integrated circuit assembly where one or more of more microelectronic devices are either wire bonded or flip-chip bonded to embodiments of printed wiring board assemblies 100 (FIG. 1C), 200 (FIG. 2B), 300 (FIG. 3B), 300' (FIG. 3C), 400 (FIG. 4), and 500 (FIG. 5) of the disclosure. Further, the disaggregated-die assembly 1210 and 1220, may be assembled with a bridge material such as in an embedded multi-interconnect bridge (EMIB) that may include at least one TSV interconnect in one of the dice being coupled to the EMIB.

The electronic system 1200 may further include one or more input devices 1230 for inputting information into the electronic system 1200 by a user, such as, for example, a mouse or other pointing device, a keyboard, a touchpad, a button, or a control panel. The electronic system 1200 may further include one or more output devices 1240 for outputting information (e.g., visual or audio output) to a user such as, for example, a monitor, a display, a printer, an audio output jack, and/or a speaker. In some embodiments, the input device 1230 and the output device 1240 may comprise a single touchscreen device that can be used both to input information to the electronic system 1200 and to output visual information to a user. The input device 1230 and the output device 1240 may communicate electrically with one or more of the memory device 1220 and the electronic signal processor device 1210.

Figure 13:
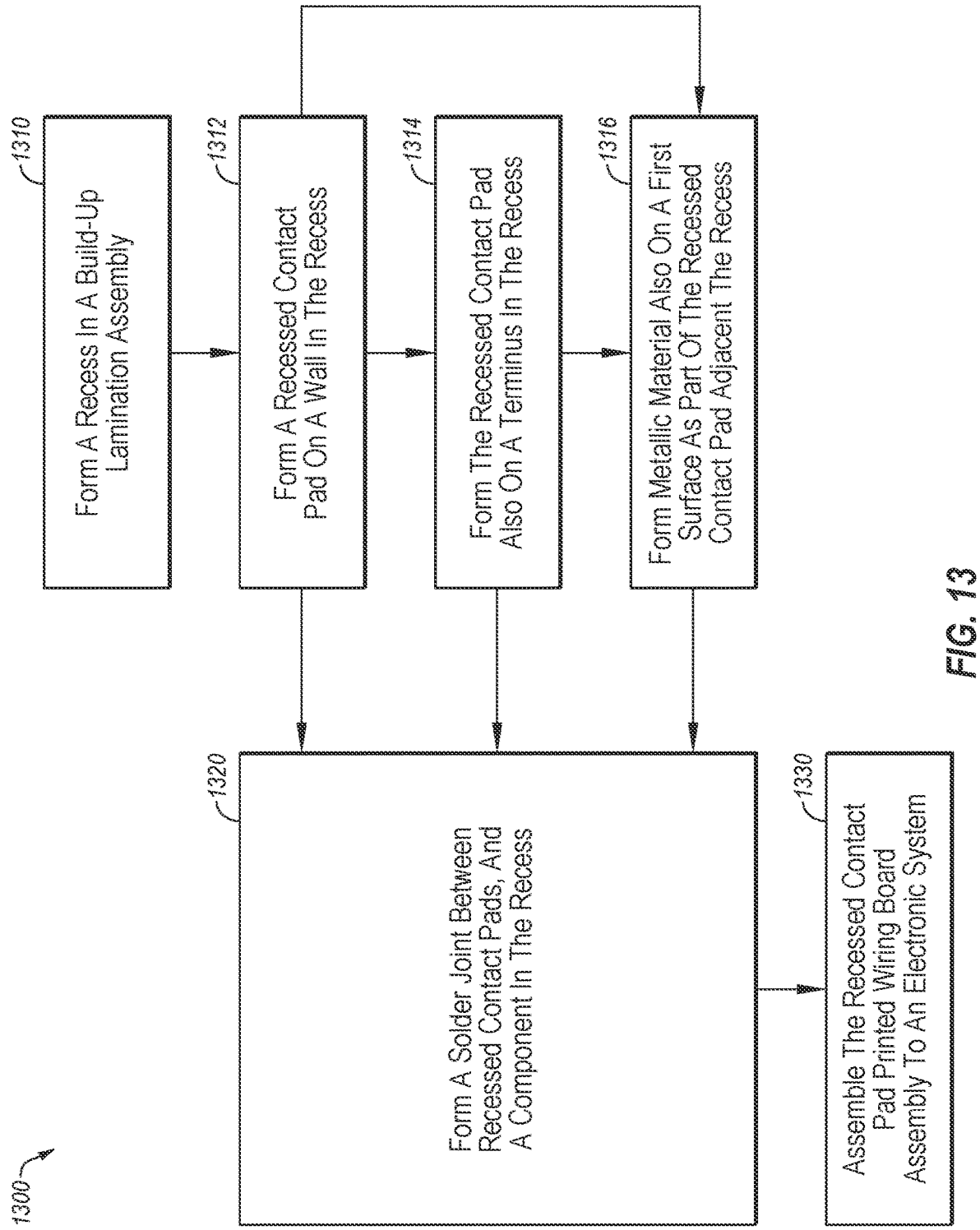
FIG. 13 is a simplified method flow diagram for a process of forming metallic material within a recess according to embodiments of the disclosure.

FIG. 13 is a simplified method flow diagram 1300 for a process of forming a printed wiring board assembly with recessed contact pads according to embodiments of the disclosure. Processing printed wiring board assemblies with recessed contact pads such as from the metallic material, e.g., the contact pads 122 and 124 illustrated in FIG. 1, and further illustrated embodiments may be described by reference to FIG. 13, and reference numbers from FIGS. 1A through 11 may be seen in the following method embodiment descriptions. A method of forming a printed wiring board assembly with recessed contact pads includes at 1310, forming a recess 112 in a build-up lamination assembly 110. At act 1312, the method includes forming recessed contact pads 122 and 124 on walls 118 and 120, respectively, in the recess 112. At act 1314, the method may also include forming the recessed contact pads 122 and 124 upon a terminus 116 in the recess 112, where a first contact pad lower portion 122B and a second contact pad lower portion 124B are integral portions of the recessed contact pads 122 and 124 against the respective first wall 118 and second wall 120. At act 1316, the method may also including forming the recessed contact pads 122 and 124 upon a first surface 114 adjacent the recess, where a first contact pad upper portion 122C and a second contact pad upper portion 124C are integral portions of the respective first and second recessed contact pads 122 and 124. Alternatively, between 1312 and 1316, only first contact pad upper portion 522C and a second contact pad upper portion 524C (e.g., FIG. 5) are formed with the recessed contact pads 522A and 524A against the respective first wall 518 and second wall 520.

At act 1320, the method includes forming a solder joint 132A between recessed contact pads 122 and 124, and a component 130A that is at least partly in the recess 112. At act 1330, the method includes assembling the recessed contact pad printed wiring board to an electronic system.

Thus, disclosed is a printed wiring board, comprising: a build-up lamination material comprising a die side and a land side; a recess in the build-up lamination material at the die side, the recess comprising: a recess floor; a first wall orthogonal to the recess floor; a second wall orthogonal to the recess floor, the second wall spaced apart from and opposite the first wall; a first recessed contact pad including a first vertical portion substantially in the recess at the first wall; a second recessed contact pad including a second vertical portion substantially in the recess at the second wall; and electrical coupling structures within the build-up lamination material, the electrical coupling structures coupled to each of the first recessed contact pad and the second recessed contact pad.

Thus, also disclosed is a printed wiring board assembly, comprising: a build-up lamination material comprising a die side and a land side; a recess in the build-up lamination material at the die side, the recess comprising: a recess floor; a first wall perpendicular to the recess floor; and a second wall perpendicular to the recess floor, the second wall horizontally offset from and opposing the first wall; a first recessed contact pad including a vertical portion within the recess at the first wall; a second recessed contact pad including an additional vertical portion within the recess at the second wall; electrical coupling structures within the build-up lamination material, the electrical coupling structures coupled to each of the first recessed contact pad and the second recessed contact pad; and a component at least partially in the recess and comprising a first electrode and a second electrode, the component coupled to the first recessed contact pad with a first solder joint at the first electrode and coupled to the second recessed contact pad with a second solder joint at the second electrode.

Thus also disclosed is electronic system, comprising: a microelectronic device on a printed wiring board, the printed wiring board comprising: a build-up lamination material comprising a die side and a land side; a recess within the build-up lamination material at the die side, and comprising: a recess floor; a first wall orthogonal to the recess floor; and a second wall orthogonal to the recess floor and opposing the first wall; a first recessed contact pad including a first vertical portion substantially within the recess at the first wall; a second recessed contact pad including a second vertical portion substantially in the recess at the second wall; and electrical coupling structures within the build-up lamination material and in electrical communication with each of the first recessed contact pad and the second recessed contact pad; and a component at least partially in the recess and coupled to the microelectronic device, the component comprising: a first electrode coupled to the first recessed contact pad with a first solder joint; and a second electrode coupled to the second recessed contact pad with a second solder joint.

Thus, also disclosed is an electronic system, comprising: an input device; an output device; a processor device operably coupled to the input device and the output device; and a memory device operably coupled to the processor device; a printed wiring board, comprising: a build-up lamination material comprising a die side and a land side; a recess in the build-up lamination material at the die side, the recess comprising: a lower vertical boundary; a first horizontal boundary orthogonal to the lower vertical boundary; and a second horizontal boundary opposing the first horizontal boundary and orthogonal to the lower vertical boundary; a first recessed contact pad including a first vertical portion substantially within the recess and at the first horizontal boundary; a second recessed contact pad including a second vertical portion substantially within the recess and at the second horizontal boundary; and coupling structures within the build-up lamination material and in electrical communication with the first recessed contact pad and the second recessed contact pad; and a component within the recess and coupled to one of the processor device and the memory device, the component comprising: a first conductive structure coupled to the first recessed contact pad through a first solder joint; and a second conductive structure, coupled to the second recessed contact pad through a second solder joint.

Components that support active microelectronic devices such as processors and memory, may be assembled to a printed wiring board where the components have a vertical profile height that is low, where the components are embedded in the printed wiring board, and are located in areas not previously useful, such as below a microelectronic device that is flip-chip mounted on the printed wiring board.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A printed wiring board, comprising:
   a build-up lamination material comprising a die side and a land side;
   a recess in the build-up lamination material at the die side, the recess comprising:
      a recess floor;
      a first wall orthogonal to the recess floor;
      a second wall orthogonal to the recess floor, the second wall spaced apart from and opposite the first wall;
      a first recessed contact pad including a first vertical portion substantially in the recess at the first wall;
      a second recessed contact pad including a second vertical portion substantially in the recess at the second wall; and
      electrical coupling structures comprising vias within the build-up lamination material, the electrical coupling structures coupled to each of the first recessed contact pad and the second recessed contact pad.

2. The printed wiring board of claim 1, wherein:
   the first recessed contact pad further comprises a first contact pad lower portion integral with and orthogonal to the first vertical portion; the first contact pad lower portion above and parallel planar with the recess floor; and
   the second recessed contact pad further comprises a second contact pad lower portion integral with and orthogonal to the second vertical portion, the second contact pad lower portion above and parallel planar with the recess floor.

3. The printed wiring board of claim 1, further comprising solder-resist material on the die side and having a first surface, and wherein:
   the first recessed contact pad further comprises a first contact pad upper portion integral with and orthogonal to the first vertical portion, the first contact pad upper portion above and parallel planar with the first surface; and
   the second recessed contact pad further comprises a second contact pad upper portion integral with and orthogonal to the second vertical portion, the second contact pad upper portion above and parallel planar with the first surface.

4. The printed wiring board of claim 1, further comprising solder-resist material on the die side and having a first surface, and wherein:
   the first recessed contact pad further comprises:
      a first contact pad lower portion integral with and orthogonal to the first vertical portion, the first contact pad lower portion above and parallel planar with the recess floor; and a first contact pad upper portion integral with and orthogonal to the first vertical portion, the first contact pad upper portion above and parallel planar with the first surface; and the second recessed contact pad further comprises:
a second contact pad lower portion integral with and orthogonal to the second vertical portion, the second contact pad lower portion above and parallel planar with the recess floor; and
a second contact pad upper portion integral with and orthogonal to the second vertical portion, the second contact pad upper portion above and parallel planar with the first surface.

5. The printed wiring board of claim 4, wherein the electrical coupling structures are contacted by the solder-resist material.

6. The printed wiring board of claim 1, wherein the electrical coupling structures comprises horizontal structures contacting each of the first recessed contact pad and the second recessed contact pad in the build-up lamination material.

7. The printed wiring board of claim 1, further comprising solder precursors on each of the first recessed contact pad and the second recessed contact pad.

8. The printed wiring board of claim 1, wherein the first recessed contact pad comprises a first recessed contact first pad and the second recessed contact pad comprises a second recessed contact first pad, and further comprising:
a first recessed contact subsequent pad at the first wall and spaced apart from the first recessed contact first pad; and
a second recessed contact subsequent pad at the second wall and spaced apart from the second recessed contact first pad.

9. The printed wiring board of claim 1, wherein:
the recess further comprises:
a third wall orthogonal and connecting to the first wall and the second wall; and
a fourth wall orthogonal and connecting to the first wall and the second wall, the third wall is spaced apart and opposite the fourth wall; and
further comprising:
an orthogonal first recessed contact pad against the third wall; and
an orthogonal second recessed contact pad against the fourth wall.

10. A printed wiring board assembly, comprising:
a build-up lamination material comprising a die side and a land side;
a recess in the build-up lamination material at the die side, the recess comprising:
a recess floor;
a first wall perpendicular to the recess floor; and
a second wall perpendicular to the recess floor, the second wall horizontally offset from and opposing the first wall;
a first recessed contact pad including a vertical portion within the recess at the first wall;
a second recessed contact pad including an additional vertical portion within the recess at the second wall;
electrical coupling structures within the build-up lamination material, the electrical coupling structures coupled to each of the first recessed contact pad and the second recessed contact pad;
a component at least partially in the recess and comprising a first electrode and a second electrode, the component coupled to the first recessed contact pad with a first solder joint at the first electrode and coupled to the second recessed contact pad with a second solder joint at the second electrode; and
solder-resist material on the die side and having a first surface, at least a portion of the component at least at or below the first surface.

11. The printed wiring board assembly of claim 10, wherein:
the first recessed contact pad further comprises a first contact pad lower portion integral with and orthogonal to the vertical portions;
the first contact pad lower portion is above and parallel with the recess floor;
the first solder joint contacts the first contact pad vertical portion and the first contact pad lower portion;
the second recessed contact pad further comprises a second contact pad lower portion that is integral with and orthogonal to the vertical portions;
the second contact pad lower portion is above and parallel with the recess floor; and
the second solder joint contacts the second contact pad vertical portion and the second contact pad lower portion.

12. The printed wiring board assembly of claim 10, further comprising solder-resist material on the die side and having a first surface, and wherein:
the first recessed contact pad further comprises a first contact pad upper portion integral with and perpendicular to the vertical portion, the first contact pad upper portion above and parallel with the first surface;
the first solder joint contacts the first contact pad vertical portion and the electrical coupling structure coupled to the first recessed contact pad;
the second recessed contact pad further comprises a second contact pad upper portion integral with and perpendicular to the additional vertical portion; the second contact pad upper portion above and parallel with the first surface; and
the second solder joint contacts the first contact pad vertical portion and the electrical coupling structure coupled to the second recessed contact pad.

13. A printed wiring board assembly, comprising:
a build-up lamination material comprising a die side and a land side;
a recess in the build-up lamination material at the die side, the recess comprising:
a recess floor;
a first wall perpendicular to the recess floor; and
a second wall perpendicular to the recess floor, the second wall horizontally offset from and opposing the first wall;
a first recessed contact first pad including a vertical portion within the recess at the first wall;
a second recessed contact first pad including an additional vertical portion within the recess at the second wall;
electrical coupling structures within the build-up lamination material, the electrical coupling structures coupled to each of the first recessed contact first pad and the second recessed contact first pad;
a first component at least partially in the recess and comprising a first electrode and a second electrode, the first component coupled to the first recessed contact first pad with a first solder joint at the first electrode and coupled to the second recessed contact first pad with a second solder joint at the second electrode;

a first recessed contact subsequent pad at the first wall and horizontally offset from the first recessed contact first pad;

a second recessed contact subsequent pad at the second wall and horizontally offset from the second recessed contact first pad; and a subsequent component at least partially in the recess and comprising a first subsequent electrode and a second subsequent electrode, the subsequent component coupled to the first recessed contact subsequent pad with a first subsequent solder joint at the first subsequent electrode, and coupled to the second recessed contact subsequent pad with a second subsequent solder joint at the second subsequent electrode.

14. An electronic system, comprising:

a microelectronic device on a printed wiring board, the printed wiring board comprising:
   a build-up lamination material comprising a die side and a land side;
   a recess within the build-up lamination material at the die side, and comprising:
   a recess floor;
   a first wall orthogonal to the recess floor; and
   a second wall orthogonal to the recess floor and opposing the first wall;
   a first recessed contact pad including a first vertical portion substantially within the recess at the first wall;
   a second recessed contact pad including a second vertical portion substantially in the recess at the second wall; and
   electrical coupling structures within the build-up lamination material and in electrical communication with each of the first recessed contact pad and the second recessed contact pad; and
a component at least partially in the recess and coupled to the microelectronic device, the component comprising:
   a first electrode coupled to the first recessed contact pad with a first solder joint; and
   a second electrode coupled to the second recessed contact pad with a second solder joint.

15. The electronic system of claim 14, wherein:

the microelectronic device is flip-chip coupled to the printed wiring board;

the microelectronic device has a footprint area on the printed wiring board; and the component is below the microelectronic device and within the footprint area.

16. The electronic system of claim 14, further comprising a solder-resist material including a first surface, and wherein:

the microelectronic device is part of a memory die array flip-chip coupled to the printed wiring board above the solder-resist material, the microelectronic device having vertical height above the solder-resist material; and the component is adjacent the memory die array and has an additional vertical height less than or equal to the microelectronic device in the memory die array.

17. An electronic system, comprising:

an input device;

an output device;

a processor device operably coupled to the input device and the output device; and a memory device operably coupled to the processor device;

a printed wiring board, comprising:
   a build-up lamination material comprising a die side and a land side;
   a recess in the build-up lamination material at the die side, the recess comprising:
   a lower vertical boundary;
   a first horizontal boundary orthogonal to the lower vertical boundary; and
   a second horizontal boundary opposing the first horizontal boundary and orthogonal to the lower vertical boundary;
   a first recessed contact pad including a first vertical portion substantially within the recess and at the first horizontal boundary;
   a second recessed contact pad including a second vertical portion substantially within the recess and at the second horizontal boundary; and
   coupling structures within the build-up lamination material and in electrical communication with the first recessed contact pad and the second recessed contact pad; and
a component within the recess and coupled to one of the processor device and the memory device, the component comprising:
   a first conductive structure coupled to the first recessed contact pad through a first solder joint; and
   a second conductive structure, coupled to the second recessed contact pad through a second solder joint.

18. The electronic system of claim 17, wherein:

the processor device is flip-chip coupled to the printed wiring board;

the processor device defines a footprint on the printed wiring board; and the component is below the processor device and within an area of the footprint.

19. The electronic system of claim 17, further comprising a solder-resist material having a first surface, and wherein:

the memory device is part of a memory die array flip-chip coupled to the printed wiring board above the solder resist material;

at least a portion of the processor device vertically overlies the solder-resist material; and the component is adjacent the memory die array and has a vertical height less than or equal to an additional vertical height of microelectronic device.

* * * * *

UNITED STATES PATENT AND TRADEMARK OFFICE
CERTIFICATE OF CORRECTION

| | | Page 1 of 1 |
|---|---|---|
| PATENT NO. | : 12,207,411 B2 | |
| APPLICATION NO. | : 17/820315 | |
| DATED | : January 21, 2025 | |
| INVENTOR(S) | : Kristopher D. Hamrick et al. | |

It is certified that error appears in the above-identified patent and that said Letters Patent is hereby corrected as shown below:

On the Title Page
    In Item (72) Inventors:    Line 4,    change "Mark A Tverdy, Boise, ID (US)" to
    --Mark A. Tverdy, Boise, (US)--

In the Specification
        Column 22,    Lines 31-32,    change "includes at 1310, forming" to
    --includes at act 1310, forming--

Signed and Sealed this
Twenty-fifth Day of March, 2025

Coke Morgan Stewart
*Acting Director of the United States Patent and Trademark Office*